US012140865B2

(12) United States Patent
Nam et al.

(10) Patent No.: US 12,140,865 B2
(45) Date of Patent: Nov. 12, 2024

(54) INORGANIC-INFILTRATED POLYMER HYBRID THIN FILM RESISTS FOR ADVANCED LITHOGRAPHY

(71) Applicants: Brookhaven Science Associates, LLC, Upton, NY (US); The Board of Regents, The University of Texas System, Austin, TX (US); The Research Foundation for the State University of New York, Albany, NY (US)

(72) Inventors: Chang-Yong Nam, Stony Brook, NY (US); Aaron Stein, Huntington Station, NY (US); Ming Lu, Stony Brook, NY (US); Jiyoung Kim, Plano, TX (US); Nikhil Tiwale, Medford, NY (US); Su Min Hwang, Plano, TX (US); Ashwanth Subramanian, Stony Brook, NY (US)

(73) Assignees: Brookhaven Science Associates, LLC, Upton, NY (US); Board of Regents, The University of Texas System, Austin, TX (US); The Research Foundation for The State University of New York, Albany, NY (US)

( * ) Notice: Subject to any disclaimer, the term of this patent is extended or adjusted under 35 U.S.C. 154(b) by 0 days.

(21) Appl. No.: 16/808,661

(22) Filed: Mar. 4, 2020

(65) Prior Publication Data
US 2020/0285148 A1 Sep. 10, 2020

Related U.S. Application Data

(60) Provisional application No. 62/853,783, filed on May 29, 2019, provisional application No. 62/814,633, filed on Mar. 6, 2019.

(51) Int. Cl.
*G03F 7/004* (2006.01)
*C08J 3/205* (2006.01)
(Continued)

(52) U.S. Cl.
CPC .......... *G03F 7/0042* (2013.01); *C08J 3/2053* (2013.01); *C08K 3/16* (2013.01); *C08L 33/12* (2013.01);
(Continued)

(58) Field of Classification Search
CPC .......................... H01L 21/0228; G03F 7/0042
See application file for complete search history.

(56) References Cited

U.S. PATENT DOCUMENTS 8,980,418 B2   3/2015  Darling et al.
2012/0207940 A1*  8/2012  Muramatsu .......... C09D 153/00
                                                          118/620
(Continued)

OTHER PUBLICATIONS

Yu-Chih Tseng et al (J. Mater. Chem., 2011, 21, 11722-11725 (Year: 2011).*

(Continued)

*Primary Examiner* — Tabassom Tadayyon Eslami
(74) *Attorney, Agent, or Firm* — Dorene Price

(57) ABSTRACT

The present invention provides a method that utilizes an existing infrastructure such as atomic layer deposition or similar vapor-based deposition tool or metal salt solutions based infiltration to infiltrate certain metals or metal-based precursors into resist materials to enhance the performance of the resists for the advancement of lithography techniques.

22 Claims, 22 Drawing Sheets

(51) Int. Cl.
    *C08K 3/16* (2006.01)
    *C08L 33/12* (2006.01)
    *C08L 39/08* (2006.01)
    *C23C 16/40* (2006.01)
    *C23C 16/455* (2006.01)
    *G03F 7/20* (2006.01)

(52) U.S. Cl.
    CPC ............ *C08L 39/08* (2013.01); *C23C 16/403* (2013.01); *C23C 16/407* (2013.01); *C23C 16/45525* (2013.01); *G03F 7/2004* (2013.01); *G03F 7/2043* (2013.01)

(56) References Cited

U.S. PATENT DOCUMENTS

2012/0241411 A1* 9/2012 Darling ............... H01L 21/3065
                                                              216/67
2015/0255298 A1* 9/2015 Darling ............... H01L 21/3081
                                                              438/703

OTHER PUBLICATIONS

Yu-Chih Tseng et al (J. Phys. Chem. C, 2011, 115, 17725-17729 (Year: 2011).*

Erika Zanchetta et al, Adv. Mater. 2013, 25, 6261-6265 (Year: 2013).*

Zanchetta et al., "Novel Hybrid Organic-Inorganic Spin-on Resist for Electron- or Photon-Based Nanolithography with Outstanding Resistance to Dry Etching," Advanced Materials, vol. 25, pp. 6261-6265; 2013.

Grenci et al., "Negative Hybrid Sol-Gel Resist as Hard Etching Mask for Pattern Transfer with Dry Etching," Microelectronic Engineering, vol. 98, pp. 134-137; 2012.

Tseng et al., "Enhanced Polymeric Lithography Resists via Sequential Infiltration Synthesis," vol. 21, pp. 11722-11725; 2011.

Tseng et al., "Enhanced Lithographic Imaging Layer Meets Semiconductor Manufacturing Specification a Decade Early," Advanced Materials, vol. 24, pp. 2608-2613; 2012.

Grenci et al., "High Resolution Spin-On Electron Beam Lithography Resist with Exceptional Dry Etching Resistance," Applied Materials Today, vol. 1, pp. 13-19; 2015.

Da Silva Moura, C. A., et al., "EUV photofragmentation study of hybrid nonchemically amplified resists containing antimony as an absorption enhancer", RSC Adv. 8 (2018) pp. 10930-10938.

Haitjema, J. et al., "Extreme ultraviolet patterning of tin-oxo cages", J. Micro/Nanolith. Mems Moems 16(3), pp. 033510-1-033510-10 (2017).

Li, L. et al., "Solubility studies of inorganic-organic hybrid nanoparticle photoresists with different surface functional groups", Nanoscale, (2016) 8, 1338-43.

Toriumi, M. et al., Metal resist for extreme ultraviolet lithography characterized by scanning transmission electron microscopy, Applied Physics Express 9 031601-1-4 (2016).

* cited by examiner

*Resist Performance*
- Sensitivity ($D_{0.5}$)
- Contrast ($\gamma$)
- Etch Resistance

*WHY EBL?*
- Readily available
- Very-high resolution
- EUVL depends on electron-resist interaction Chem. Soc. Rev., 2017, 46, 4855-4866 https://www.microchemicals.com/technical_infomation/exposure_photoresist.pdf

Schematic representation of a typical infiltration synthesis process.

Scanning electron micrographs of as developed sub-micron features patterned into 4 cycle infiltrated hybrid resist using EBL.

INORGANIC-INFILTRATED POLYMER HYBRID THIN FILM RESISTS FOR ADVANCED LITHOGRAPHY

The present application claims priority from U.S. provisional patent application Ser. No. 62/814,633, filed on Mar. 6, 2019, and U.S. provisional patent application Ser. No. 62/853,783, filed on May 29, 2019, both of which are incorporated herein in their entirety.

STATEMENT OF GOVERNMENT RIGHTS

The present application was made with government support under contract number DE-SC0012704 awarded by the U.S. Department of Energy. The United States government has certain rights in the invention(s).

FIELD OF THE INVENTION

This application relates to the methodologies of preparing and using inorganic-infiltrated organic polymer thin films, where inorganic components are certain metals, metal oxides or metal-based precursors, as organic-inorganic hybrid thin film resist materials to enhance the performance of resists and improve lithography techniques.

BACKGROUND

The tremendous computational power possessed by today's modern computer chips is due to millions of transistors with critical dimension as small as 10 nm. Lithography-based patterning has been instrumental in achieving such a high device density. In order to meet the growing requirements of patterning smaller and smaller linewidths at high throughput, continuous advances in the lithography techniques has been essential. For the sub-10 nm nodes and beyond, extreme ultraviolet (EUV) lithography, one of the most recent one of such advancements, with 13.5 nm wavelength is being implemented for high volume manufacturing. Use of such a short wavelength for the lithography is expected to decrease the number of patterning steps in the fabrication process flow as well as decrease the layout complexity by replacing multi-patterning steps with single-step EUV patterning [Chem. Soc. Rev. 2017, 46, 4855].

The resists for EUV lithography pose rigorous requirements such as high optical absorption, high etch resistance, high sensitivity and resolution as well as low line edge roughness (LER). The traditional go-to candidates, such as chemically amplified resists (CARs), fall short in meeting these necessities. For smaller nodes, these traditional carbon-based resist materials typically show poor etch resistance and are thus insufficient for allowing etching-based pattern transfer of high-aspect-ratio structures onto the substrate. Metal containing organic-inorganic resists are being investigated to meet these needs, the reason for which is threefold. The first two are increase in etch resistance due to addition of more robust metal atoms into the polymeric backbone and improvement in line-edge roughness (LER) due to the use of smaller molecules compared to CARs. Additionally, the third advantage of the hybrid approach stems from the perceived mechanism of EUV lithography, where the energy levels within the constituting atoms absorb the incident EUV radiation generating secondary electrons that then cause the changes in the resist's chemical structure, as against to the inter-atomic chemical bonds directly absorbing the incident radiation in case of earlier lithography wavelengths (e.g. 193 nm). This means that by addition of metals with high EUV absorption coefficient could be utilized for enhancing resist sensitivity and thus, achieving required throughput even with the currently existing low power EUV sources. FIG. 1 illustrates the atomic absorption cross section of various elements for 13.5 nm wavelength.

Many avenues are being investigated for developing EUV resist materials containing metal atoms such as Zr, Hf, Sn, Ti (Chem. Mater. 2015, 27, 5027; Nanoscale 2016, 8, 1338; Appl. Phys. Express 2016, 9, 031601; Proc. SPIE Advances in Patterning Materials and Processes XXXV 2018, 10586, 105860K). The popular approaches that have been implemented to address this challenge are based on metal oxide nanoparticles coated with organic shell of photoactive ligands such as acrylate derivatives [Nanoscale 2016, 8, 1338]; metal containing oxo-cages (J. Micro/Nanolith. MEMS MOEMS, 2017, 16(3), 033510); and metal containing salt complexes (RSC Adv., 2018, 8, 10930-10938).

All these approaches depend heavily on optimizing complex chemical synthesis and require establishment of new infrastructure. Moreover, the limited shelf-life of these resist materials also possess restriction on their long-term use. In particular, metal-oxide nanoparticle approach may fall short in achieving required low LER for future nodes, whereas metal containing salt complexes are inherently likely to only provide low metal loading.

Therefore, there remains a need for improved methods to prepare resist materials for advanced lithography methods.

SUMMARY OF THE INVENTION

The present invention provides improved methods to prepare resist materials for advanced lithography methods using existing infrastructure and materials without the need for complex chemical synthesis methodologies.

In one embodiment, the present invention provides a method of preparing a metal-infiltrated resist material, said method comprising, consisting essentially of, or consisting of: infiltrating a metal into a resist material to provide the metal-infiltrated resist material; and wherein infiltrating comprises vapor-based infiltration using atomic layer deposition (ALD) tools, or liquid-phase infiltration.

In one embodiment, the present invention provides a method of lithography, said method comprising, consisting essentially of, or consisting of: obtaining a metal-infiltrated resist material made by a process according to the aforementioned; and patterning the metal-infiltrated resist material to provide a patterned metal-infiltrated resist material.

This application relates to infiltrated PMMA (polymethylmethacrylate) organic methodologies and infiltrating certain metals or metal-based precursors (also referred to herein as metal precursors) into resist materials to enhance the performance of resists and improve lithography techniques.

DETAILED DESCRIPTION

The present invention provides improved methods to prepare resist materials for advanced lithography methods using existing infrastructure without the need for complex chemical synthesis methodologies.

As used herein, "metal-infiltrated resist material", "hybrid resists", and "metal-infiltrated resist" are used interchangeably to describe the resist material of the present invention.

The present method relies upon infiltrating certain metals, including but not limited to Al, Zn, Sn, Ti, Zr, Hf, In, Sb, Co, Ni, Pd, W, Pt, Au, Cu, Ga, Zn, Cr, Fe, Cs, and their oxides into the thin films of a resist material. One metal, one metal oxide, or a doped metal oxide (e.g., a combination of one metal and one metal oxide) may be used in the infiltration; or a combination of two or more metals, a combination of two or more metal oxides, or doped metal oxides (e.g., a combination of two or more metals and metal oxides) may be used in the infiltration for desired results.

Examples of suitable metal oxides include $AlO_x$, $ZnO_x$, $SnO_x$, $HfO_x$, $TiO_x$, $ZrO_x$, $GaO_x$, $InO_x$ and other metal oxides. In some embodiments, the metal oxide includes $Al_2O_3$, ZnO, $SnO_2$, $HfO_2$, $ZrO_2$, $Nb_2O_5$, $Ga_2O_3$, $In_2O_3$ and $TiO_2$.

The metals may be in the form of a metal-based precursor. An example of a metal-based precursor includes but not limited to trimethylaluminum (TMA), diethyl zinc (DEZ), titanium isopropoxide, trimethyl gallium, Tetrakis(diethylamido)tin and other ALD precursor.

Any resist material commonly known in the art may be used. For example, suitable resist materials include poly (methyl methacrylate) (PMMA) and similar acrylate based resist derivatives, ZEP series, CSAR series, polystyrene derivatives, PVP, poly(2-vinylpyridine), poly(4-vinylpyridine) derivatives, poly(methyl glutarimide) (PMGI), phenol formaldehyde resin (DNQ/Novolac), polyhydoxystyrene-based polymers, polyacrylonitrile and polyimides.

Further examples of suitable resist materials include Shipley UV series resists, CSAR series, and ZEP series.

The infiltration of the metal or metal oxide can be carried out by vapor phase infiltration using the currently available tools including but not limited to atomic layer deposition chamber and/or by liquid-based infiltration using solutions of metallic salts. The synthesized hybrid resists are suitable for lithographic patterning and subsequent pattern transfer or etching.

In some embodiments, the infiltrating includes vapor-based infiltration by using atomic layer deposition (ALD) tools of an ALD system.

In some embodiments, the infiltrating includes vapor based infiltration.

Figure 12:
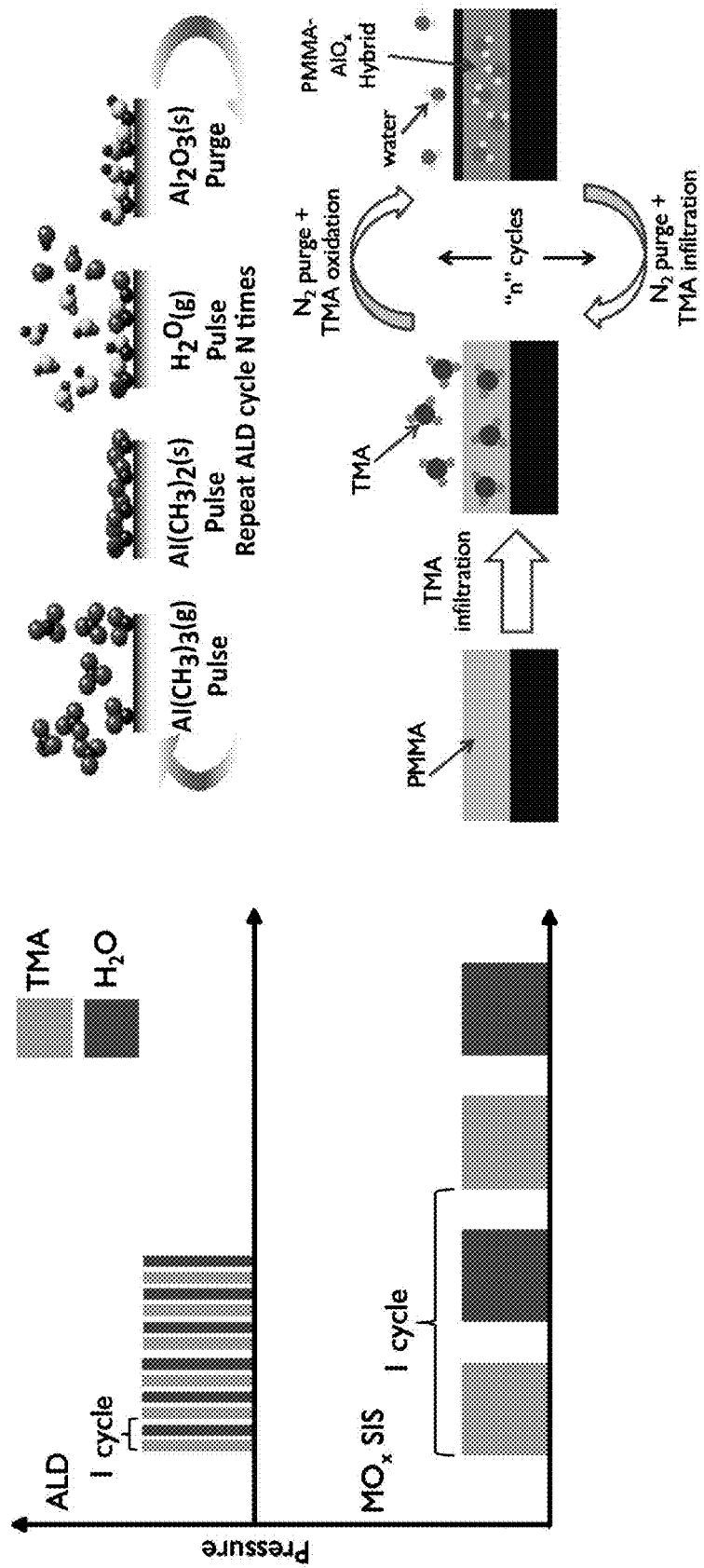
FIG. 12 depicts infiltration synthesis (IS).
Figure 13:
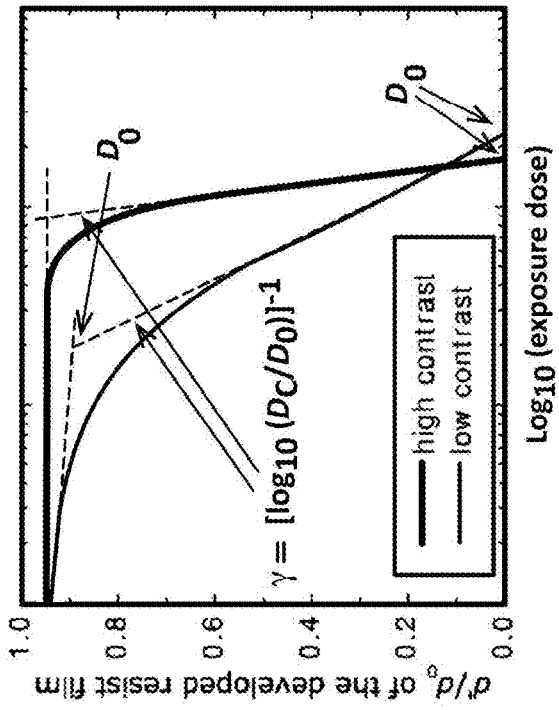
FIG. 13 depicts and explains how electron beam lithography (e-beam lithography or EBL) is useful for studying EUV resist processes
Figure 13:
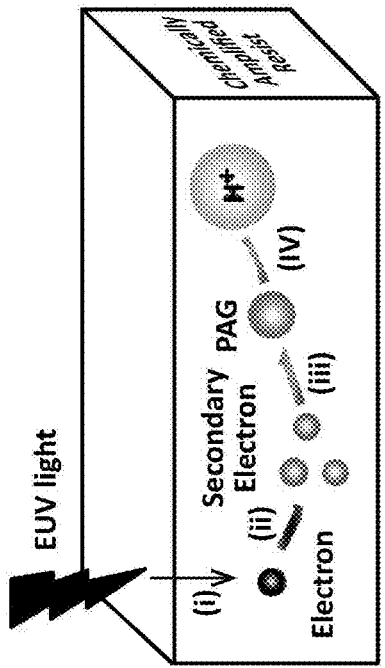
Figure 14:
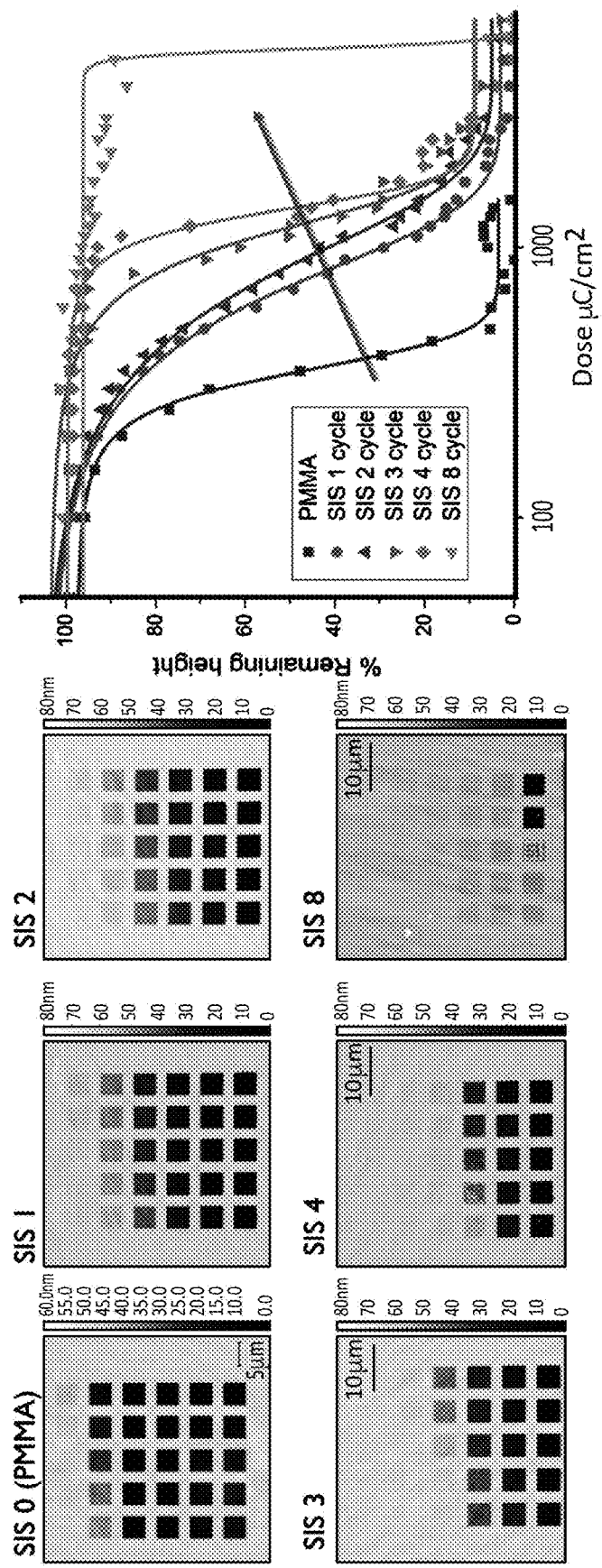
FIG. 14 depicts E-beam dose tests for SIS 0 (PMMA), SIS 1, SIS 2, SIS 3, SIS 4, and SIS 8, and a dose response curve for PMMA, and cycles of SIS 1, SIS 2, SIS 3, SIS 4, and SIS 8.
Figure 15:
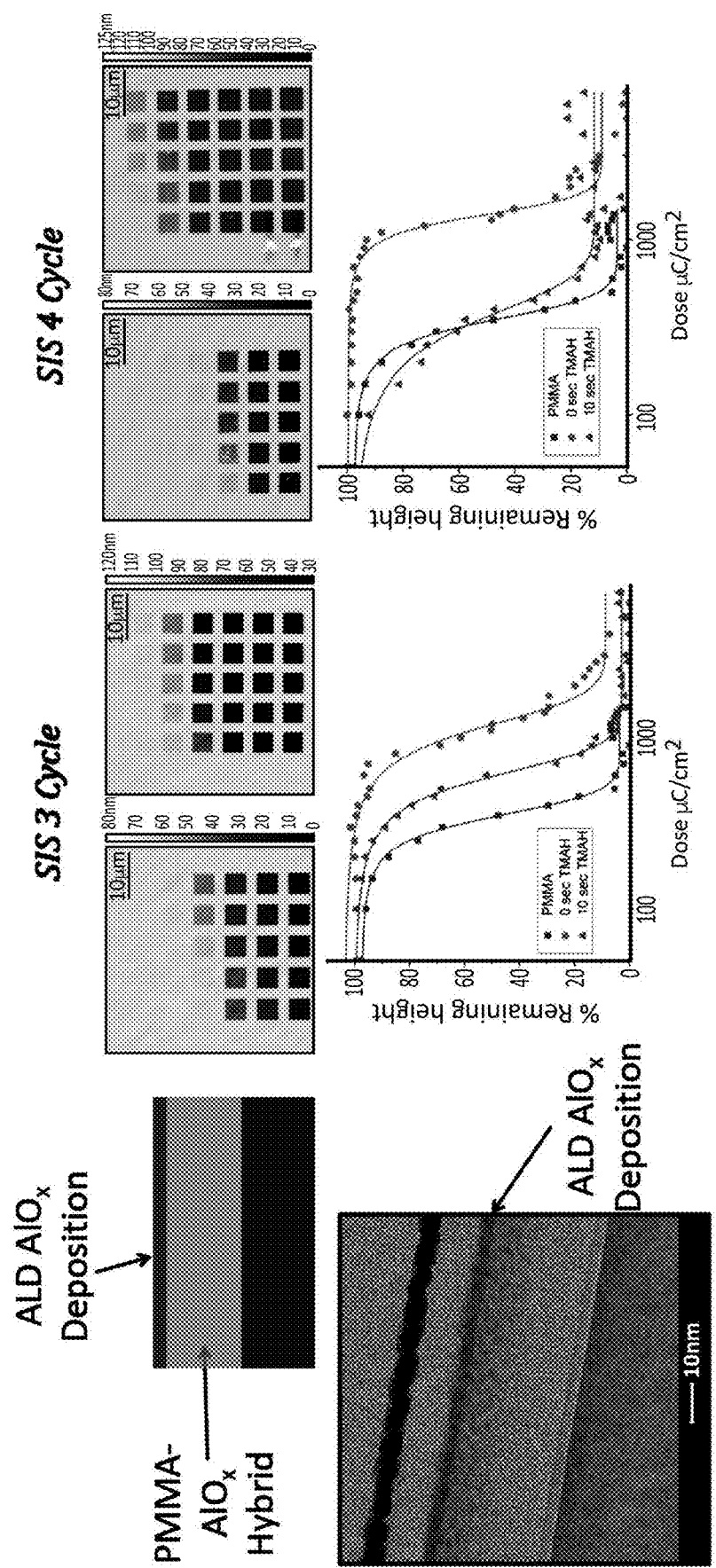
FIG. 15 depicts tuning the resist response with TMAH dip showing a schematic representation of ALD $AlO_x$ Deposition on PMMA-$AlO_x$ Hybrid, showing four atomic force microscopy (AFM) images, two images for SIS 3 Cycle and two images for SIS 4 Cycle, showing an image of ALD $AlO_x$ Deposition, and showing a dose response curve for SIS 3 Cycle and for SIS 4 Cycle.
Figure 16:
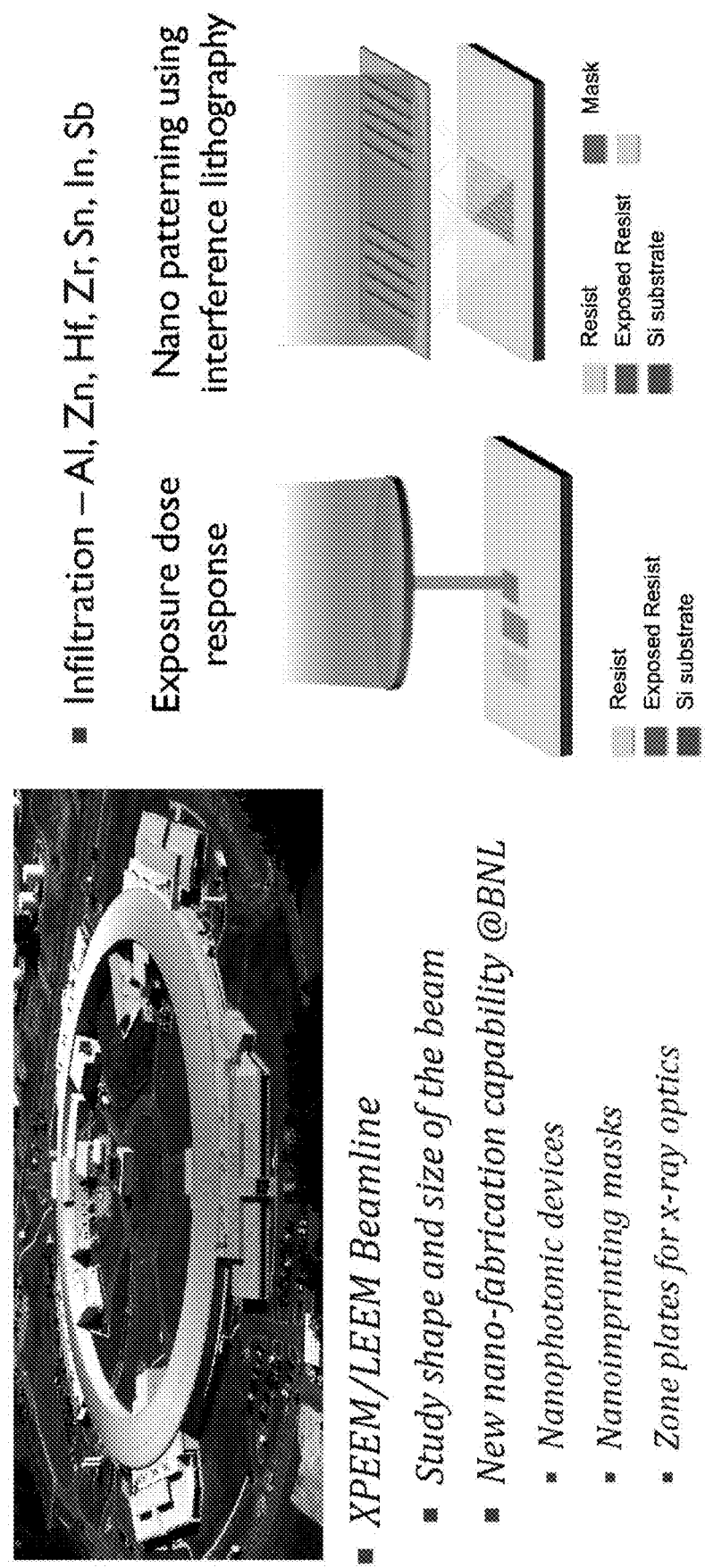
FIG. 16 depicts EUV (soft x-ray) lithography at NSLS-II.

In some embodiments, sequential infiltration synthesis (SIS) is used. See FIG. 12 for an exemplary SIS process.

Figure 17:
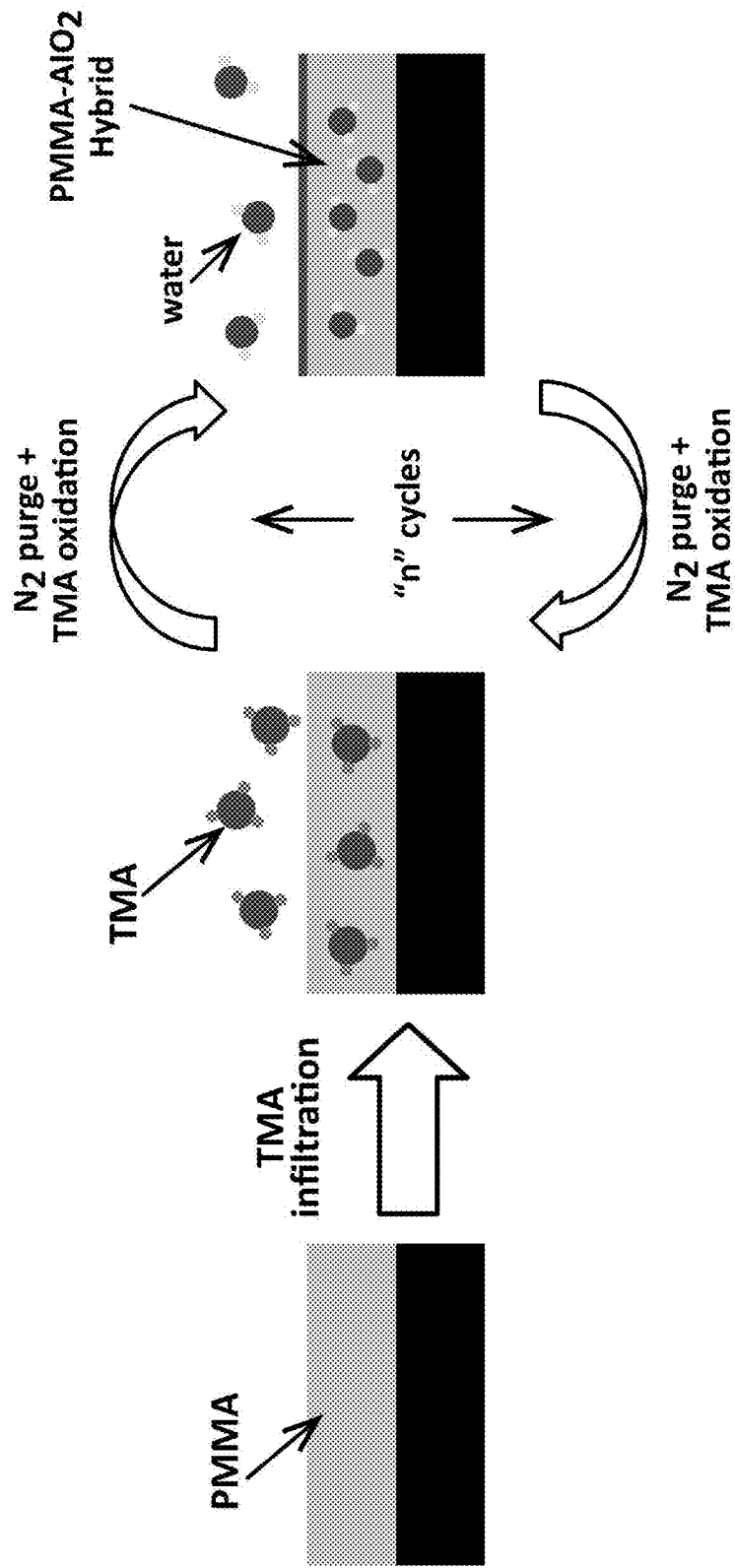
FIG. 17 depicts a schematic representation of an infiltration synthesis process.
Figure 18:
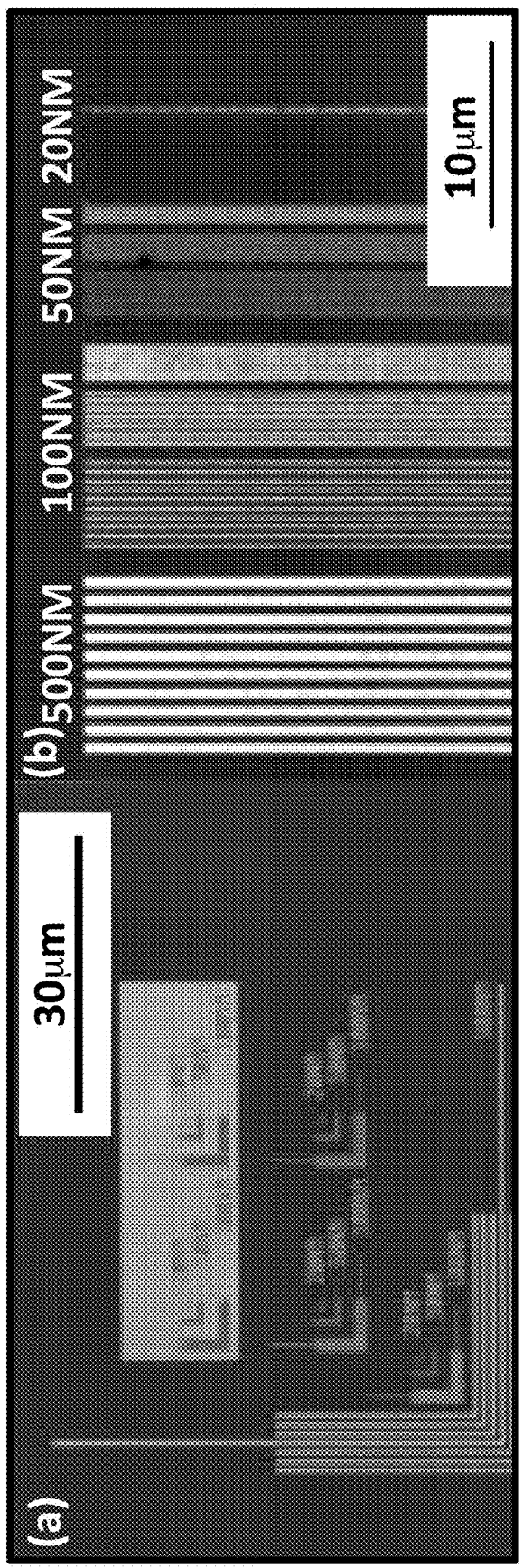
FIG. 18 depicts scanning electron micrographs of as developed sub-micron features patterned into 4 cycle infiltrated hybrid resist using EBL.
Figure 19:
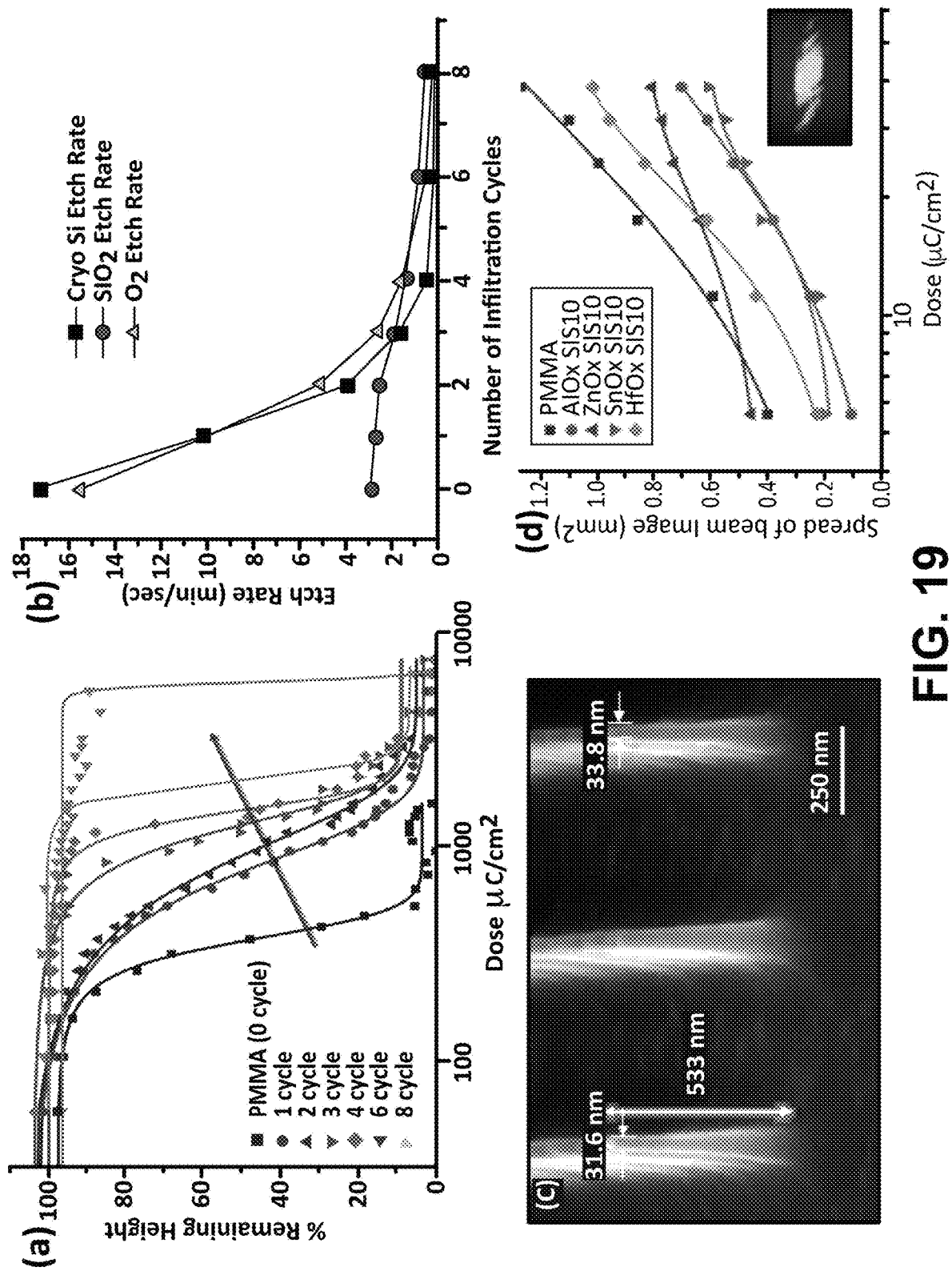
FIG. 19 depicts evolution of resist characteristics of the hybrid nanocomposites resist with increasing number of infiltration cycles (a) dose response curve (b) resist etch rate for differently used recipes (c) 60° tilted SEM Image of Si nanostructures etched using $Al_2O_3$, infiltrated resist under cryo-Si recipe and (d) Results from the EUV lithography experiments at NSLS-II summarized as analysis of the area spread of the beam on hybrid resists continuing different metal oxides infiltrated into PMMA matrix, with inset showing optical microscope image of the beam onto PMMA after exposure and development.

In some embodiments, the vapor based infiltration uses 1-12 cycles, 1-8 cycles, 1-4 cycles, 4-8 cycles, or 2-6 cycles. In an exemplary embodiment, one cycle includes a purge and oxidation step, and an infiltration step. See FIG. 17.

In some embodiments, the vapor based infiltration includes contacting the resist with a metal for a total of 30-800 seconds, 30-500 seconds, 40-100 seconds, or 40-80 seconds.

The metal is oxidized. In some embodiments, vapor based infiltration includes contacting the resist with water vapor for a total of 40-100 seconds or 40-80 seconds to oxidize the metal.

In some embodiments, the metal comprises a metal ion species selected from the group consisting of $PtCl_4^{2-}$ and $AuCl_4^{2-}$ or other metal precursors.

Figure 3:
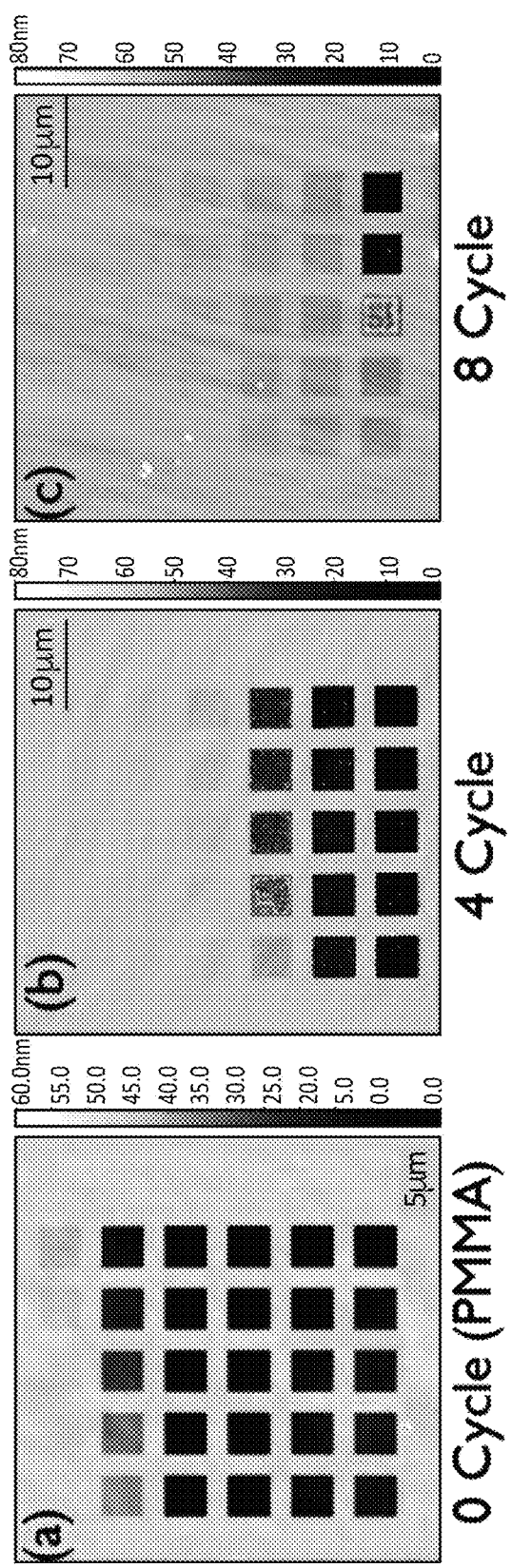
FIG. 3 depicts an atomic force microscopy (AFM) image of an electron beam lithography (EBL) dose test performed on $AlO_x$-PMMA hybrid resist with (a) 0-cycle i.e. PMMA (polymethyl methacrylate) as spin-coated, (b) 4-cycles and (c) 8-cycles of $AlO_x$ infiltration.
Figure 4:
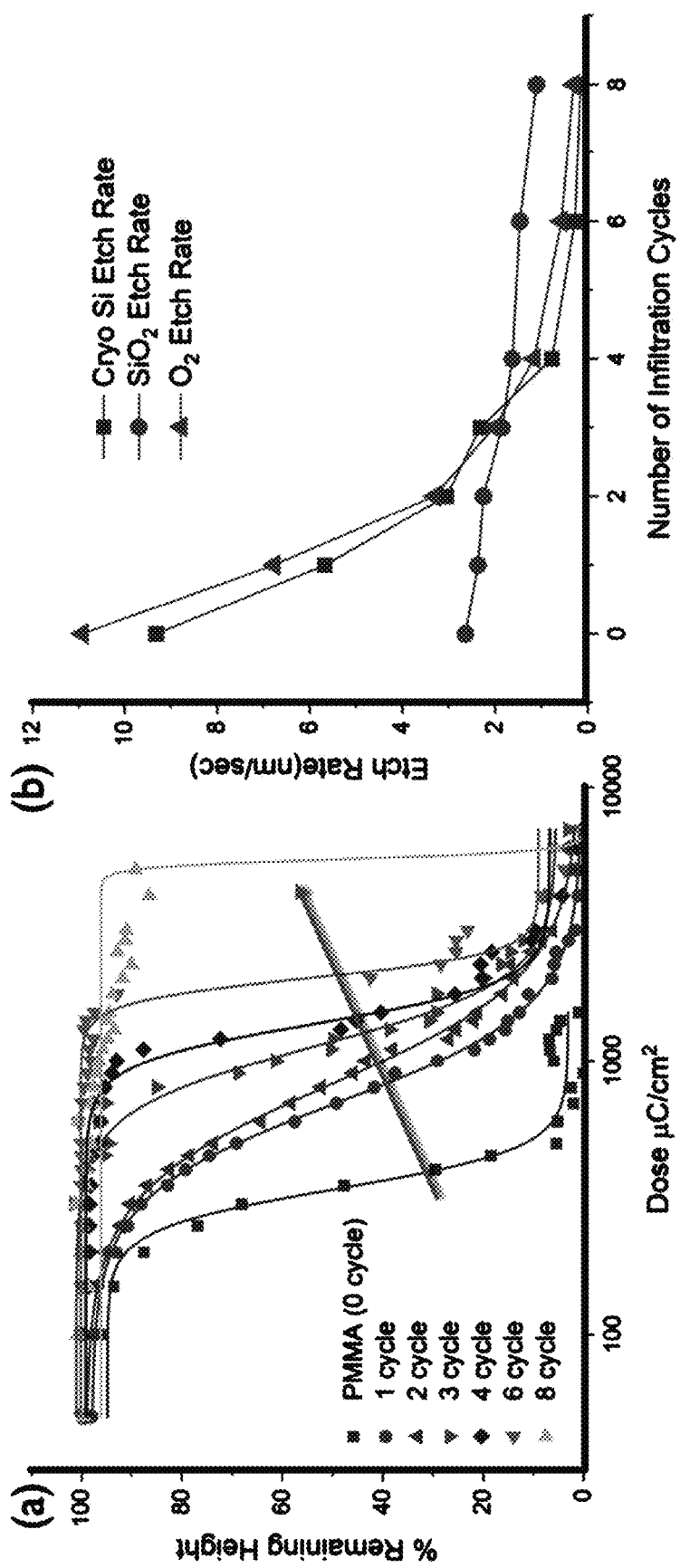
FIG. 4 depicts evolution of resist characteristics of the hybrid nanocomposite resist with increasing number of infiltration cycles (a) dose response curve for PMMA (0 cycle), 1 cycle, 2 cycle, 3 cycle, 4 cycle, 6 cycle, and 8 cycle, and (b) resist etch rate for differently used etch recipes, Cryo Si, $SiO_2$, and $O_2$.

In one embodiment, the invention provides a method of preparing a metal-infiltrated resist by use of a vapor infiltration process, wherein metal-based precursor trimethylaluminum (TMA) is infiltrated into PMMA film using ALD (atomic layer deposition) tools followed by oxidation of TMA into $AlO_x$ via exposure to $H_2O$ vapor, generating a hybrid nanocomposite thin film. In the present embodiment vapor phase infiltration is achieved using an ALD system. The tools or components of the ALD system may be used in the present embodiment to perform vapor phase infiltration. For different numbers of infiltration cycles, the patterning characteristics of the synthesized hybrid resist may be determined using EBL. FIG. 3 shows atomic force microscopy (AFM) image of a dose test performed on $AlO_x$-PMMA hybrid resist with 4-cycles of infiltration. Marked improvement in the resist contrast ($\gamma$) may be seen as the number of infiltration cycles are increased, with a minor loss of sensitivity (FIG. 4(a)). The evolution of resist etching rate for various etch recipes, as illustrated in FIG. 4(b), showed a prominent enhancement in the etch resistance for chemical etch with increased infiltration compared to physical etch. With the use of 4 cycle infiltrated hybrid resist, lines and elbow patterns may be patterned down to 50 nm linewidth, which can be seen in FIGS. 5A and 5B.

Figure 7:
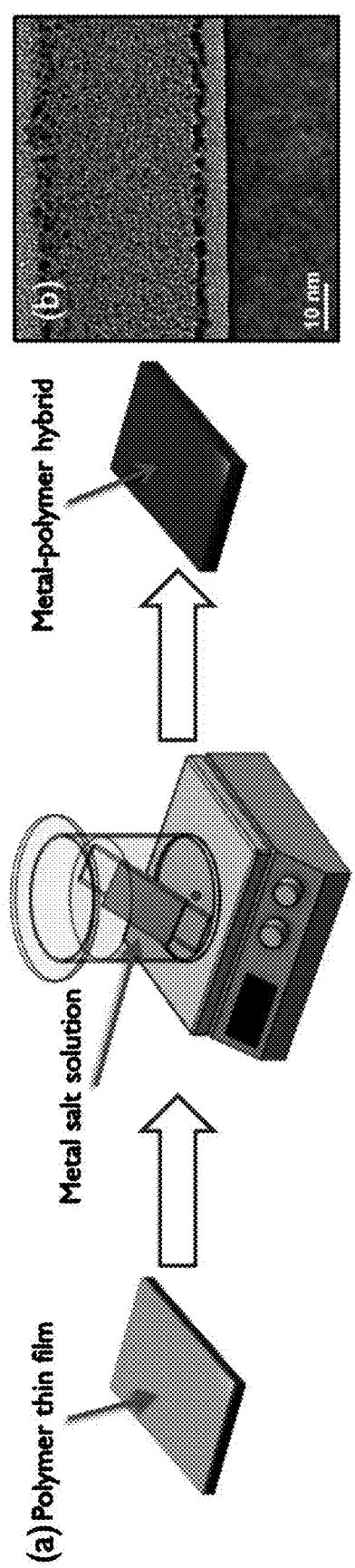
FIG. 7 depicts (a) schematic representation of liquid phase infiltration process, and (b) cross-sectional transmission electron microscopy (TEM) image depicting uniform Pt infiltration into PVP thin film.
Figure 8:
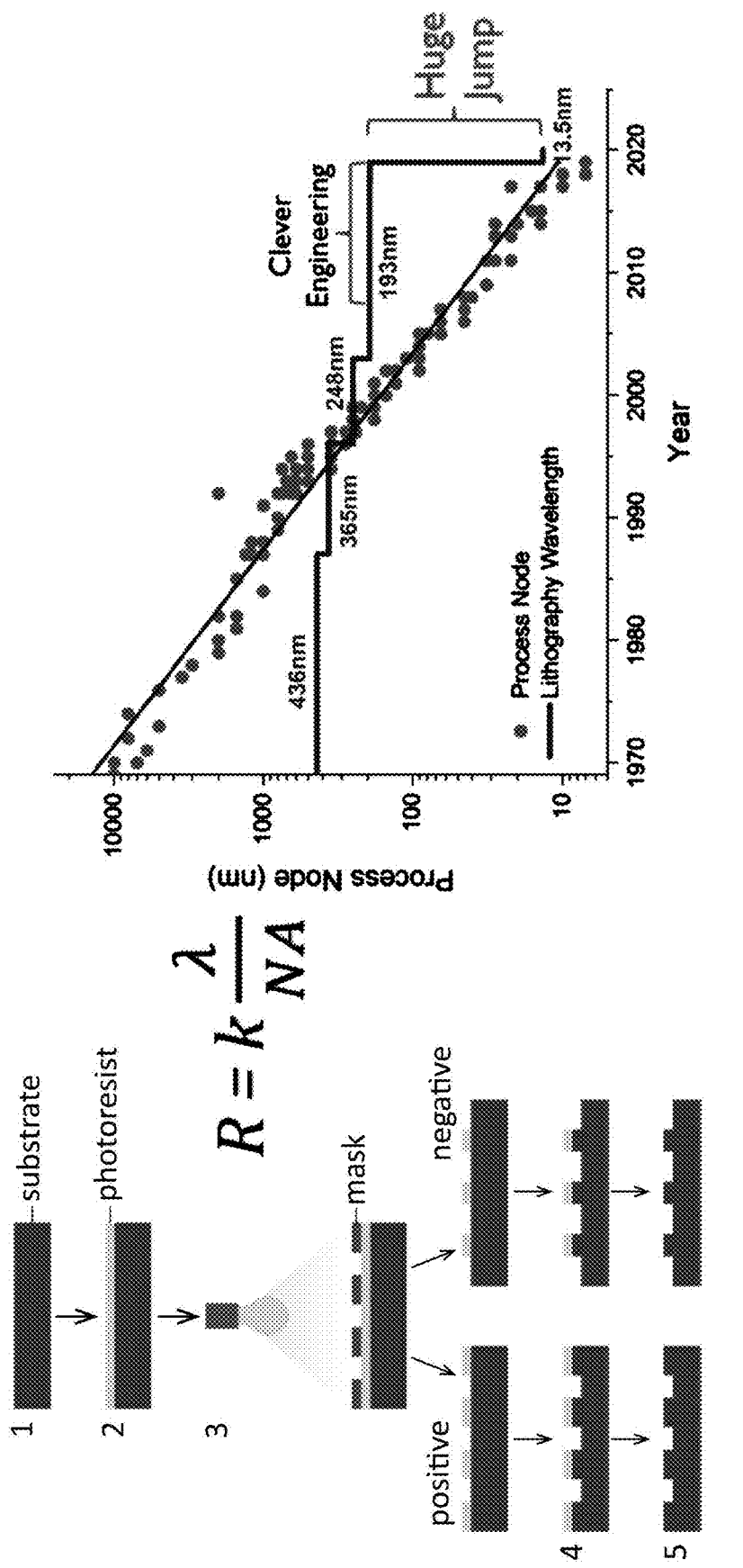
FIG. 8 depicts lithography and exposure wavelength, and depicts a plot of process nodes (nm) over years.
Figure 9:
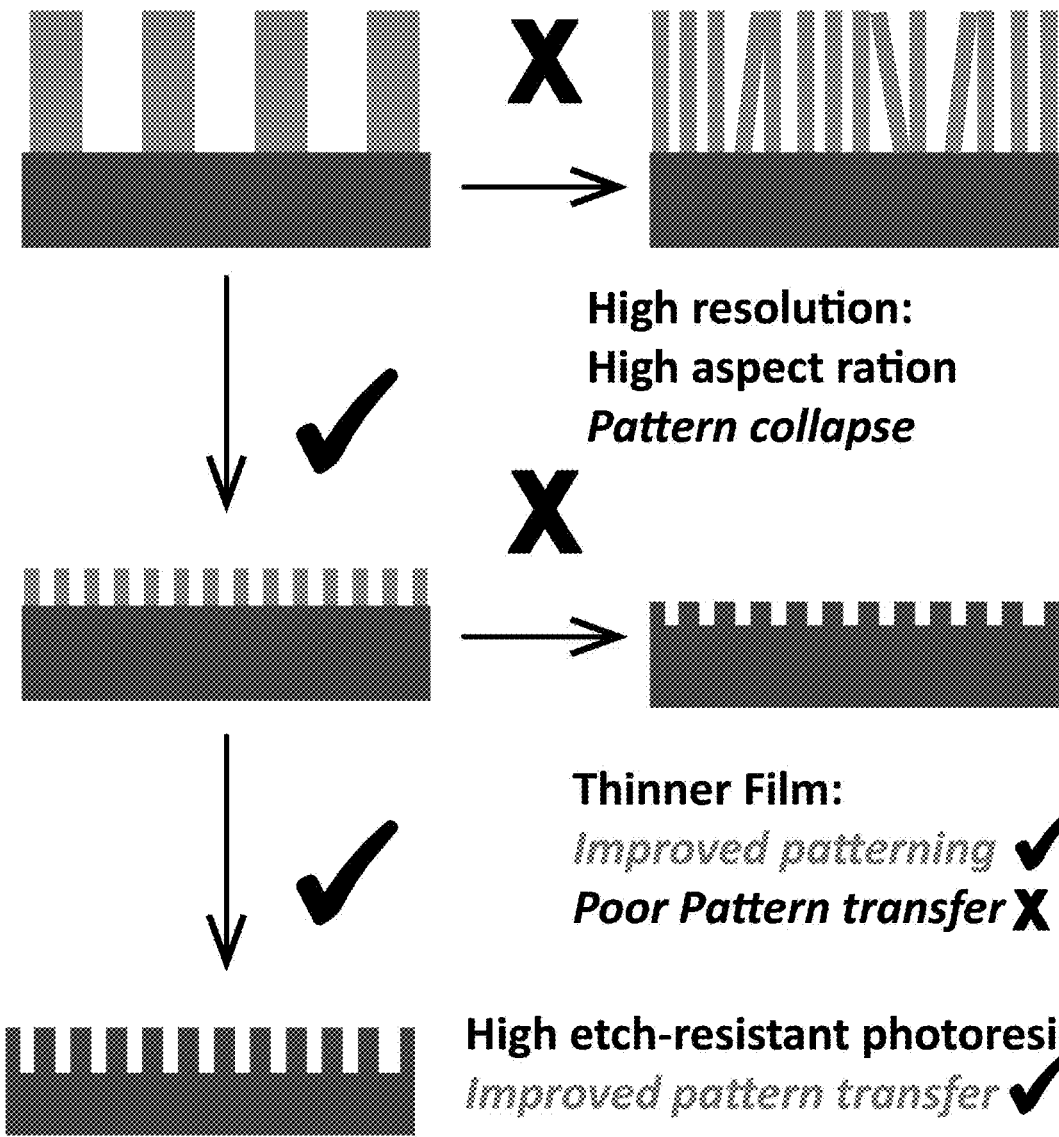
FIG. 9 depicts high resolution resist challenges.
Figure 10:
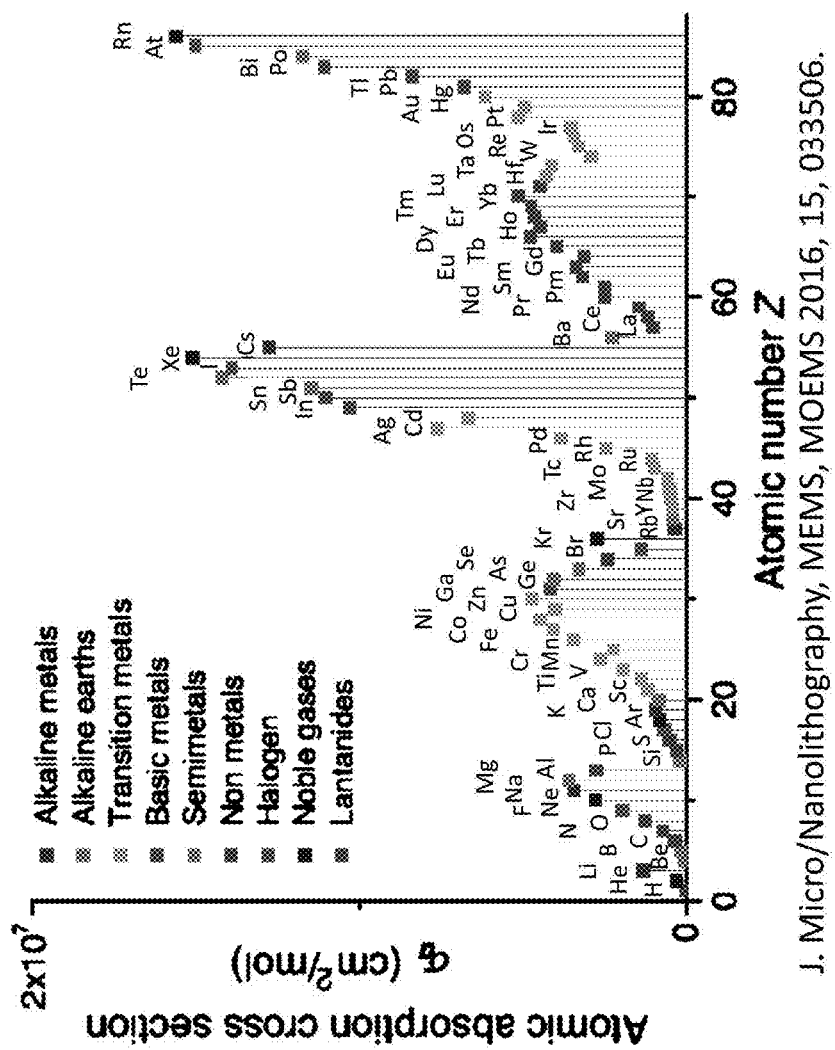
FIG. 10 depicts organic-inorganic hybrid resists.
Figure 11:
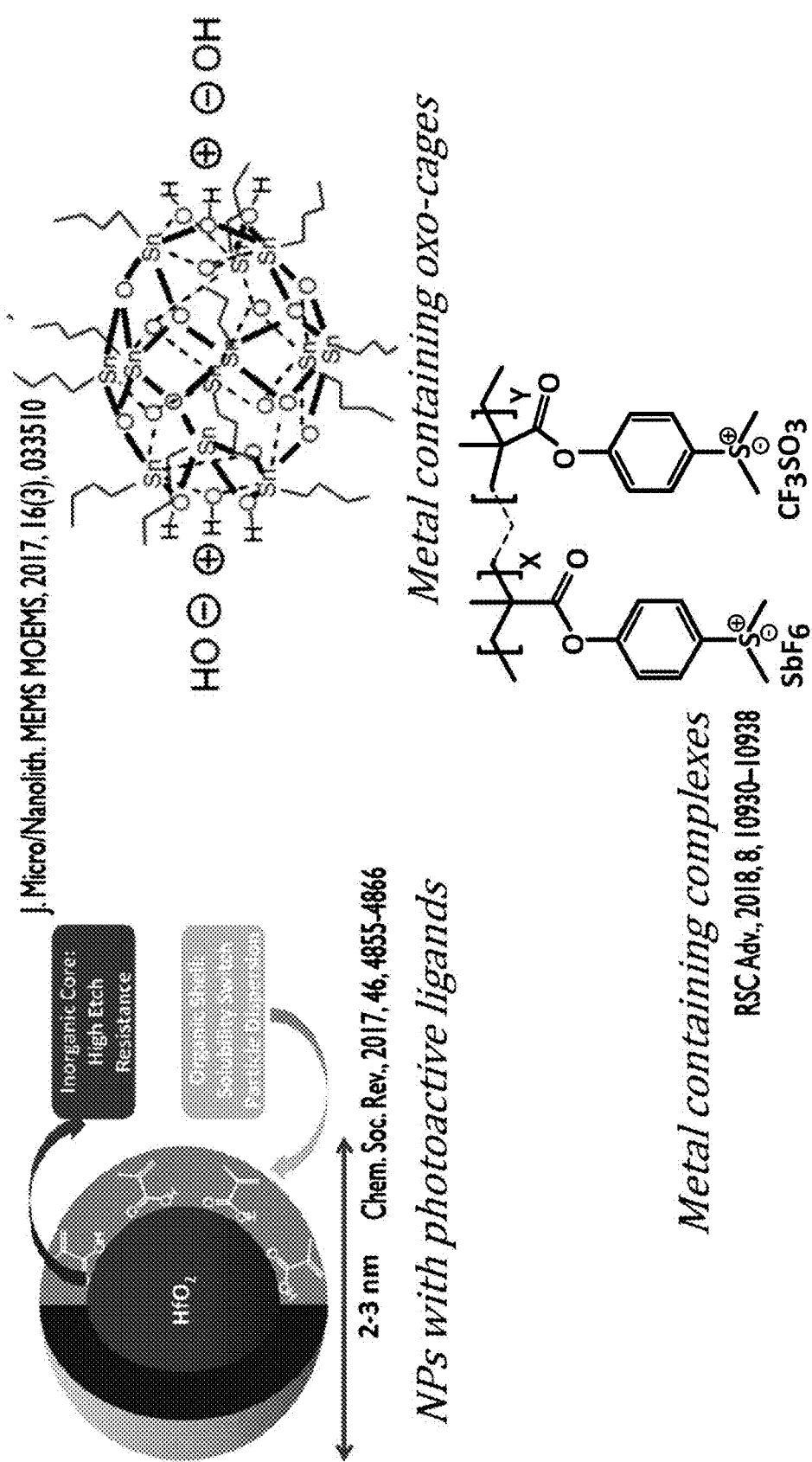
FIG. 11 depicts organic-inorganic hybrid resists for EUV-lithograph (EUVL)

In one aspect, the invention provides a method of preparing a metal-infiltrated resist by use of a liquid phase infiltration method. In this aspect, a resist (described above) is immersed into a metal salt solution of a defined metal salt concentration, for a defined time, and at a defined temperature. See FIG. 7 for an embodiment of the process of this aspect.

In some embodiments, the concentration of the metal salt is 10-100 mM, 10-40 mM, 10-30 mM, 20-30 mM, or 15-25 mM.

In some embodiments, the infiltration temperature is 20-80° C., 20-50° C., 20-40° C., 20-30° C., 60-80° C., 40-80° C., 50-80° C., or 18-30° C.

In some embodiments, the infiltration temperature is 20-25° C., 40-45° C., 60-65° C., or 80-85° C.

The resist is soaked in the metal salt solution for 1-1000, 1-100, 1-500, 250-750, 400-600, 40-100, 500-1000, 750-1,000, or 50-80 seconds. This defines the soak time.

In some embodiments, the soak time is 50-80 seconds.

In some embodiments, resist material comprises PVP, the salt solution includes $Na_2PtCl_4$ at a concentration of 15-25 mM; the infiltration temperature is 18-30° C.; and the soak time is 50-80 seconds.

In some embodiments, a liquid phase polymer metal hybridization method is used, in which, the photoresist thin films spun on suitable substrates may be immersed into a metal salt solution. The reactive metal ion species diffuse into the polymer and react with functional groups present within the polymer. For instance, PVP, a pyridine ring containing polymer, when protonated may form pyridinium ion which complexes with metal ion species including but not limited to $PtCl_4^{2-}$, $AuCl_4^{2-}$. The process is schematically depicted in FIG. 7(a), while a cross section TEM image of Pt hybridized PVP is shown in FIG. 7(b). The amount of infiltration can be controlled via controlling the metal salt concentration, infiltration time and infiltration temperature.

After infiltration, the polymer films may be rinsed in solvents suitable for removing the loosely bound salt that may be remaining on the surface of the films and can subsequently be used for lithography purposes.

Figure 20:
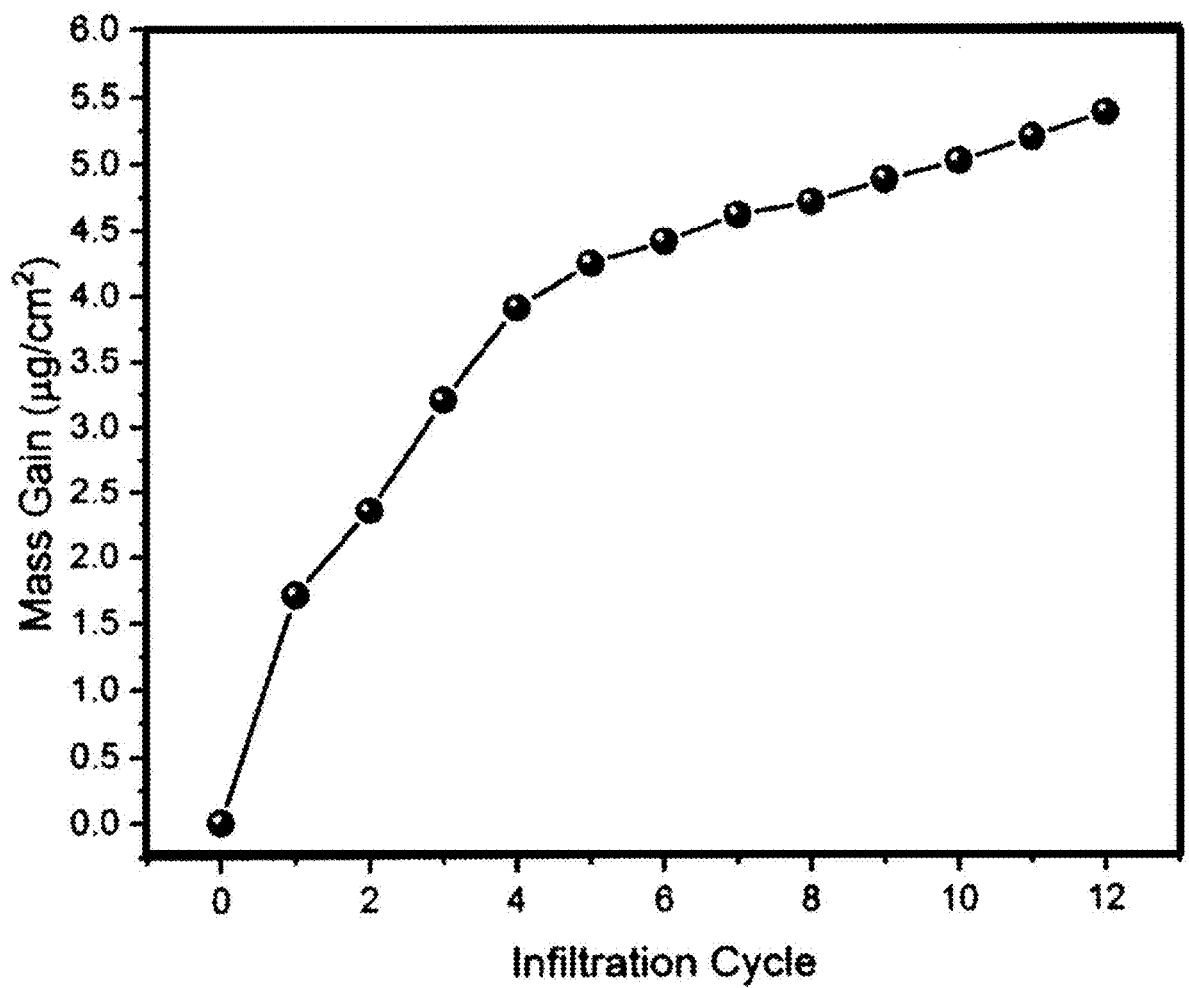
FIG. 20 depicts variation of quartz crystal microbalance (QCM) estimated $AlO_x$ mass gain against number of infiltration cycles.
Figure 21:
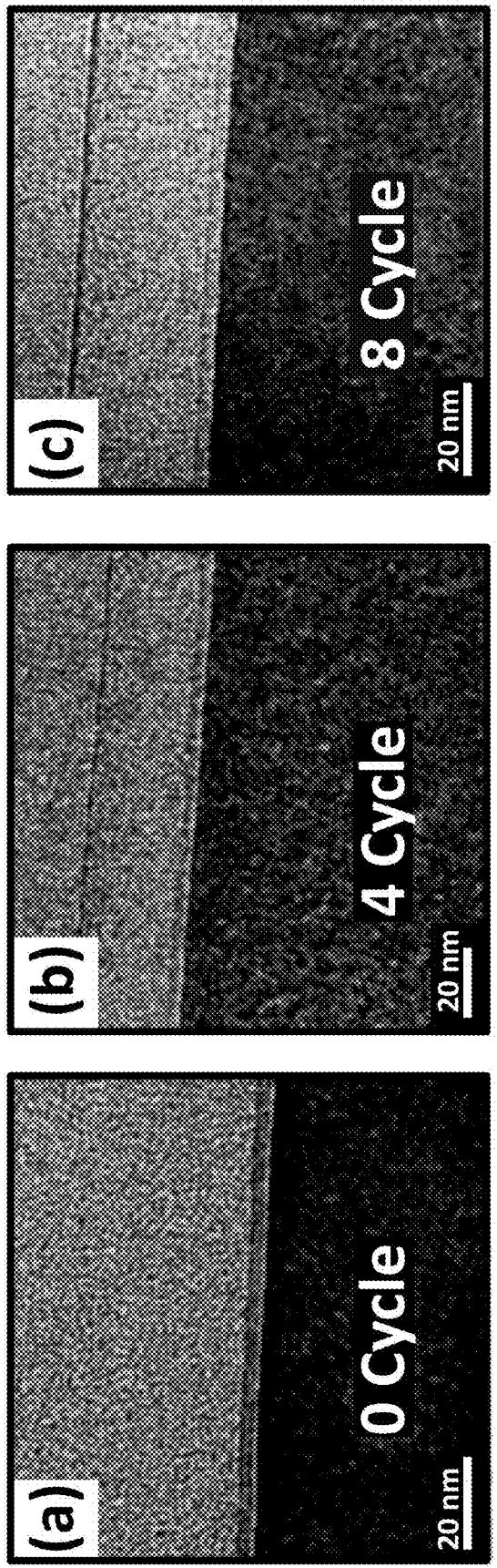
FIG. 21 depicts TEM images of the cross sections of resist thin films (a) without any infiltration (0-cycle), (b) after 4-cycles of infiltration, and (c) after 8 cycles of infiltration with increasing dense thin layer of $AlO_x$ forming at the top surface with increasing amount of infiltration.

Using the methods described above, a metal is infiltrated into the starting resist material creating an infiltrated metal resist. There may be a deposition of metal or metal oxide on the surface of the starting resist material. The metal-infiltrated resist may be characterized by the mass gain as a result of the methods disclosed herein. See FIG. 20 for an embodiment of the method disclosed herein, wherein mass gain is determined.

Figure 22:
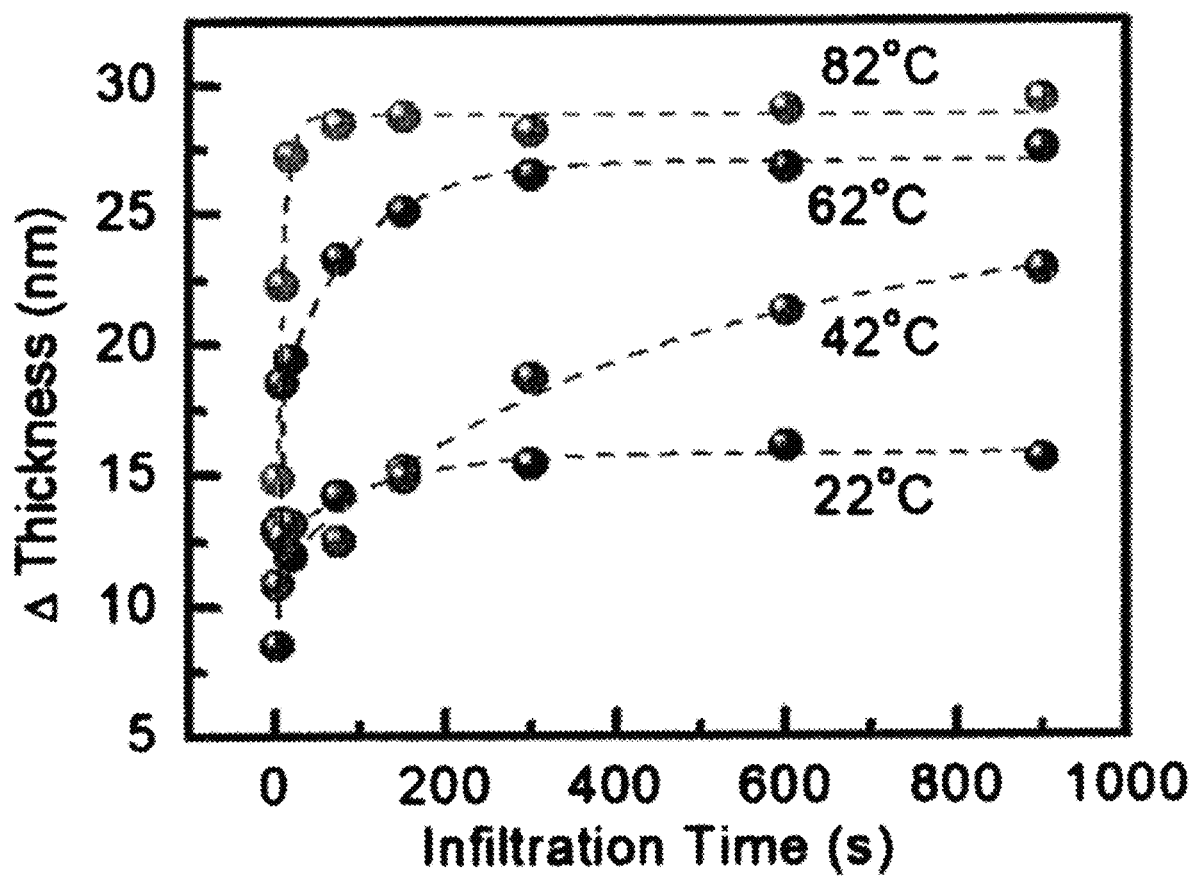
FIG. 22 depicts change in PVP (poly(vinylpyridine)) photoresist film thickness when infiltrated with Pt metal at the following temperatures: 22° C., 42° C., 62° C., and 82° C.

Using the methods described above, a metal is infiltrated into the starting resist material creating a metal-infiltrated resist that may have a metal layer having a thickness. In some embodiments, the thickness is greater than about 1 nm, greater than about 2 nm, greater than about 3 nm, greater than about 4 nm, or greater than about 5 nm. In some embodiments, the metal-infiltrated resist material comprises a thickness of between about 5 nm and 50 nm, 5 nm and 40 nm, 10 nm and 50 nm, 10 nm and 40 nm, 20 nm and 40 nm, 1 nm and 20 nm, 10 nm and 20 nm, or 1 nm and 10 nm. The thickness may also be described as a change in thickness ($\Delta$ thickness), this is the difference in thickness from before the infiltration process to after the infiltration process. See FIG. 22 for exemplary metal-infiltrated resist material and process, and the measured change in thickness.

In another aspect, the invention provides a lithography method, including patterning and/or etching of the substrate with metal-infiltrated resist material used as a etch mask described above.

The lithography performance of the metal-infiltrated resist materials disclosed herein may provide several benefits over the resist materials of the prior art. Examples of benefits include etch resistance, LER improvement, and higher sensitivity.

Etch resistance—the presence of inorganic entities in the organic backbone may provide higher stability to the resist, thus protecting them from plasma damage and increasing etch resistance during pattern transfer.

LER improvement—as compared to (chemical amplified resist) CARs, these hybrid resist could have smaller molecules, thus leading to lower LER after the development.

Higher sensitivity—Hybrid resist containing certain metal atoms can absorb the incident EUV radiation more efficiently. This may assist in faster pattern exposure and thus, higher lithography throughput.

In some embodiments, EUV resist materials may contain metal atoms such as Zr, Hf, Sn, or Ti. Vapor-phase infiltration of metals and/or metal oxides is an effective way to enhance the etch resistance of these resists, using ALD tools.

The resolution of an optical lithography system may depend on the wavelength used for patterning. The radiation source may have a wavelength of less than 500 nm, less than 400 nm, less than 300 nm, less than 200 nm, less than 100 nm, less than 50 nm, or less than 20 nm.

Accordingly, industrial lithography instruments may exploit visible g-line (436 nm), UV i-line (365 nm), deep UV 248 nm and 193 nm to achieve a desired pattern linewidth. For sub-10 nm nodes and beyond, EUV with 13.5 nm wavelength may be implemented for high volume manufacturing. Use of such a short wavelength for lithography may decrease the number of patterning steps in the fabrication process flow and the layout complexity by replacing multi-patterning steps with single-step EUV patterning.

Exemplary lithographic methods include EBL and EUV lithography.

In some embodiments, interference lithography may be used.

In some embodiments, spin-coated thin films of polymeric resist on Si substrates is infiltrated with different concentrations of inorganic species. The higher atomic absorption of suitable inorganic additive atoms for EUV radiation is expected to improve the sensitivity of the original resist and, thus, increase the throughput of lithographic patterning step.

The lithography performance of the metal-infiltrated resist material disclosed herein can be characterized as follows.

Resist sensitivity & contrast extraction using exposure dose tests by varying the exposure time at constant exposure intensity followed by the development of the resist. The thickness of the remaining resist in these regions is measured with stylus profilometer or AFM measurement and plotted against the exposure energy to estimate sensitivity and contrast of each resist composition. The sensitivity of PMMA at EUV exposures is ~25 mJ/cm$^2$. [Fallica et. al. J VST B, 2017, 35, 061603]

Resist resolution and LER characterization: Nanoscale patterns are exposed on the resist-coated sample.

After development of the resist patterns, SEM is used to determine the resolution and LER of the developed patterns.

In some embodiments, the exposed patterns are subject to etching. Etching methodologies commonly known in the art may be applied to the patterned hybrid resists described herein.

In some embodiments, exposed patterns can also be subjected to reactive ion etching to demonstrate high-aspect ratio patterning capability.

In some embodiments, plasma dry etching is used.

In some embodiments, the invention provides a method of patterning and etching the hybrid resist material described herein. In some embodiments, the resulting nanostructures have a linewidth of less than about 100 nm, less than about 50 nm, less than about 40, less than about 35, less than about 25 nm, less than about 10 nm, or less than about 5 nm. In some embodiments, the linewidths are between about 5 nm and 50 nm, 10 nm and 50 nm, or between 15 nm and 35 nm.

In some embodiments, the nanostructures have an aspect ratio of greater than about 5, greater than about 10, greater than about 15, or greater than about 20. In some embodiments, the aspect ratio is between about 5 and 50, 10 and 50, 10 and 30, or 15 and 25.

In some embodiments, the metal infiltrated resists of the present invention have an etch selectivity of greater than about 10, 15, or 20. In some embodiments, the etch selectivity is between about 10 and 40, 10 and 20, 15 and 40, 15 and 20, or 30 and 40. In some embodiments, the maximum etch selectivity may be 300, 350, 400, 450, 500, or more. In some embodiments, the maximum etch selectivity may be about 300 or more for the present metal infiltrated resists having AlO$_x$ infiltrated into PMMA.

While PMMA has been popular e-beam lithography resist, a major backbone component of a number of commercial deep UV photoresists (such as UV6 by Shipley) are based on acrylate derivative and are thus quite similar in their mechanism to PMMA. Thus, the process according to the present invention can be with these resists to infuse inorganics into them. AlO$_x$ is a popular choice of hard mask material, particularly in fluorine-based Si etch recipes, due to the formation of AlF$_3$, a robust ceramic with very high melting point. Thus, infiltration of AlO$_x$ into UV6 that already exist in the semiconductor production flow, may provide benefits. Moreover, infiltration of SnO$_x$ may provide critical advantage due to the high absorption cross section of Sn for EUV wavelength (13.5 nm), thus resulting in improved sensitivity of the resist and lead to high-throughput lithography patterning.

In some embodiments, AlO$_x$ may be infiltrated into UV6 and the resulting metal-infiltrated resist material is further subject to lithography.

In some embodiments, SnO$_x$ may be infiltrated into UV6 and the resulting metal-infiltrated resist material is further subject to lithography.

Throughout this specification, quantities are defined by ranges having a lower boundary and upper boundary, and by lower or upper boundaries. Each lower boundary can be combined with each upper boundary to define a range. Two lower boundary values can be combined to define a range, and two upper boundary values can be combined to define a range. The lower and upper boundaries should each be taken as a separate element.

In the present disclosure, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

EXAMPLES

The present invention is illustrated in further details by the following non-limiting examples.

Example 1, Vapor Phase Infiltration Method of Metals into a Resist Material. AlO$_x$ is Infiltrated into PMMA Commercially available 2 weight % PMMA (Molecular Weight 950000 gm/mol—MicroChem) in anisole was spin coated on cleaned silicon substrates at 7500 rpm for 60 sec, followed by 3 min baking at 180° C. hotplate to form ~60 nm film as measured by ellipsometry.

The substrates with as spun PMMA film were then infiltrated at 85° C. with different AlO$_x$ amount by varying the number of infiltration cycles from 1-12 using a commercial ALD system (Cambridge Nanotech Savannah S100). Each infiltration cycle consisted of TMA exposure for total 60 sec, during which TMA precursor was pulsed for 14 msec every 10 sec, followed by purging of the ALD chamber with 100 sccm N$_2$ for 2 min. Consequently, the substrates were exposed to water vapor for total 60 sec, while the 40 msec pulses were employed every 10 sec, followed by 2 min purge by 100 sccm N$_2$, completing the infiltration cycle.

The amount of alumina inclusion into the PMMA matrix was estimated using QCM measurements. As shown in the figure below, resulting areal mass gain for different number of infiltration cycles increases continuously. With up to 12 infiltration cycles, the amount of mass gain due to alumina inclusion was estimated to be 5.36 µg/cm$^2$. The depicted examples of e-beam patterning were conducted using 4-cycle infiltrated samples (3.89 μg/cm² of AlO$_x$), which was then utilized for producing etched Si nanostructures using cryogenic Si etch recipe.

QCM estimated AlO$_x$ mass gain against number of infiltration cycles was tested on metal infiltrated resist material prepared by vapor phase infiltration method disclosed herein. See FIG. 20.

Figure 1:
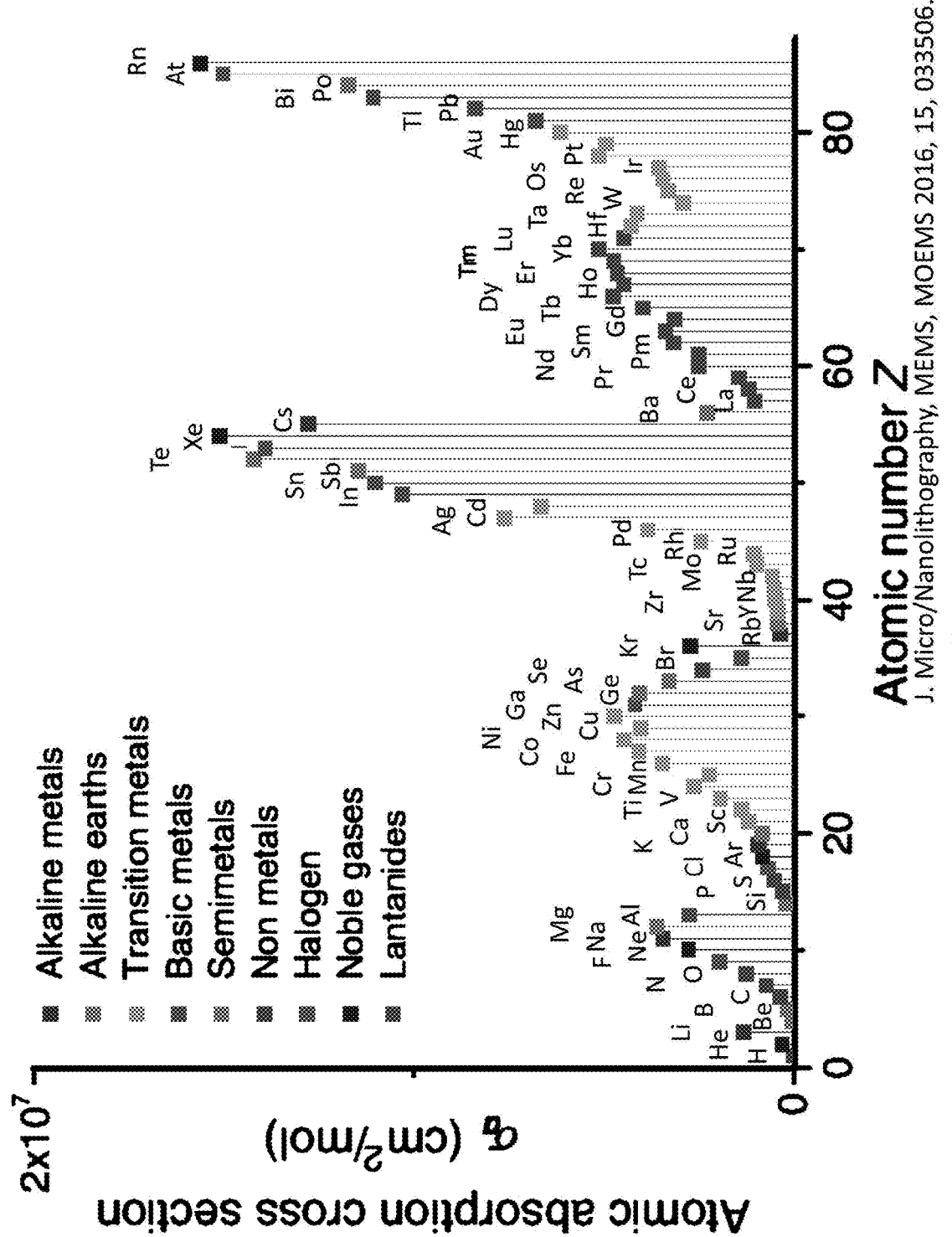
FIG. 1 depicts atomic absorption cross sections of various elements for 13.5 nm wavelength radiation (J. Micro/Nanolithography, MEMS, MOEMS 2016, 15, 033506).
Figure 2:
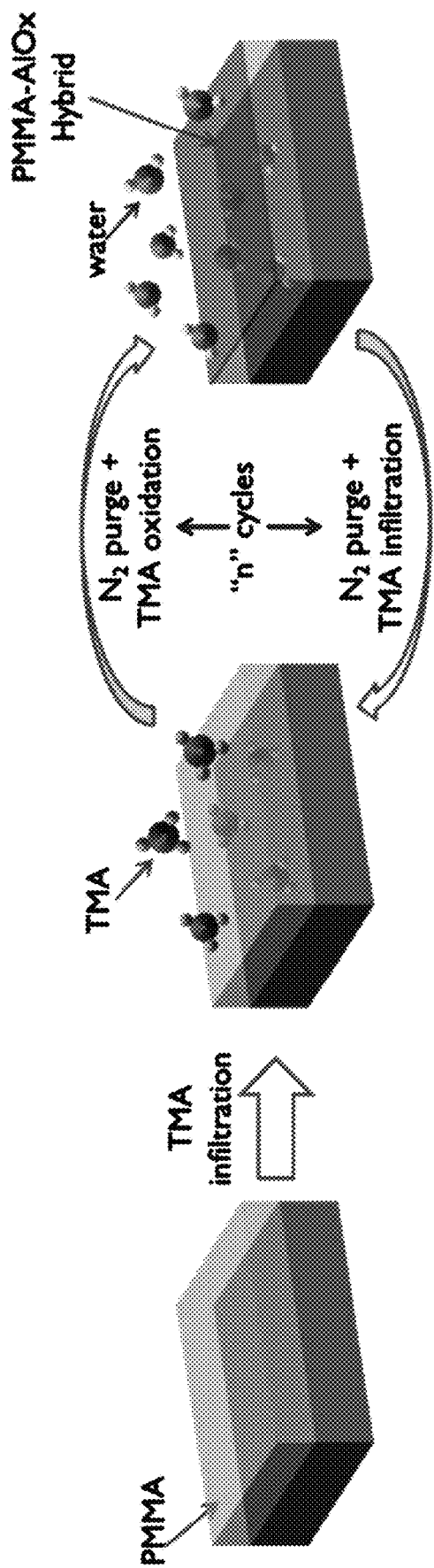
FIG. 2 depicts a schematic representation of an exemplary vapor-phase infiltration synthesis process.

A vapor infiltration process is depicted in FIG. 2; wherein ALD precursor TMA is infiltrated into PMMA film followed by oxidation of TMA into AlO$_x$ via exposure to H$_2$O vapor, generating a hybrid nanocomposite thin film. For different numbers of infiltration cycles, the patterning characteristics of the synthesized hybrid resist may be investigated using EBL. FIG. 3 shows AFM image of a dose test performed on AlO$_x$— PMMA hybrid resist with 4-cycles of infiltration. Marked improvement in the resist contrast (γ) may be seen as the number of infiltration cycles are increased, with a minor loss of sensitivity (FIG. 4(a)). The evolution of resist etching rate for various etch recipes, as illustrated in FIG. 4(b), showed a prominent enhancement in the etch resistance for chemical etch with increased infiltration compared to physical etch. With the use of 4 cycle infiltrated hybrid resist, lines and elbow patterns may be patterned down to 50 nm linewidth, which can be seen in FIG. 5(a, b).

Figure 5:
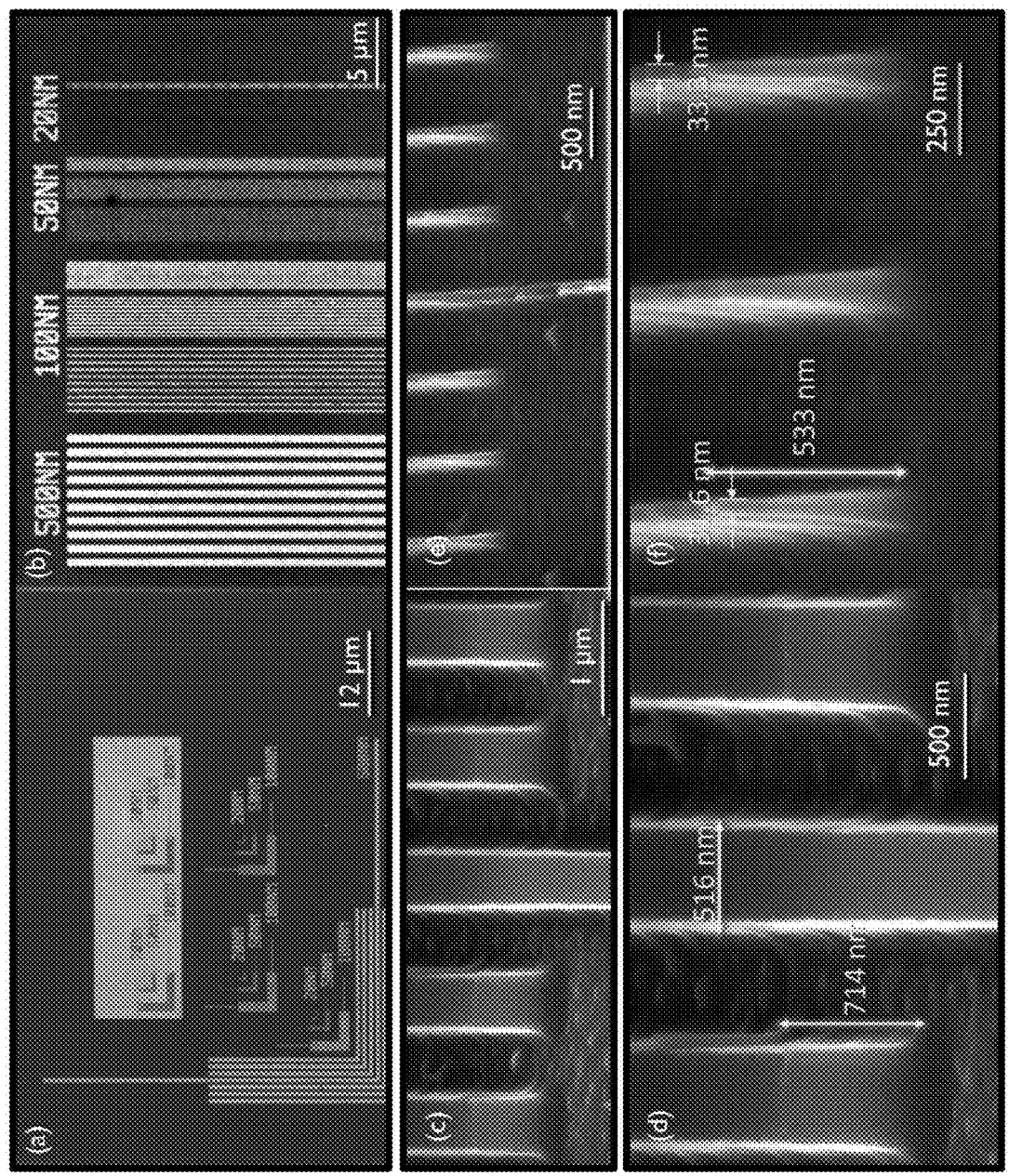
FIG. 5 depicts (a) scanning electron microscopy (SEM) micrographs, and (b) as developed sub-micron features patterned into 4-cycle infiltrated hybrid resist using EBL. (c), (d), (e), and (f) show 60° tilted view SEM images of Si nanostructures etched using 4-cycle infiltrated resist and etched under cryo-Si recipe at −100° C. under cryo-Si recipe.
Figure 6:
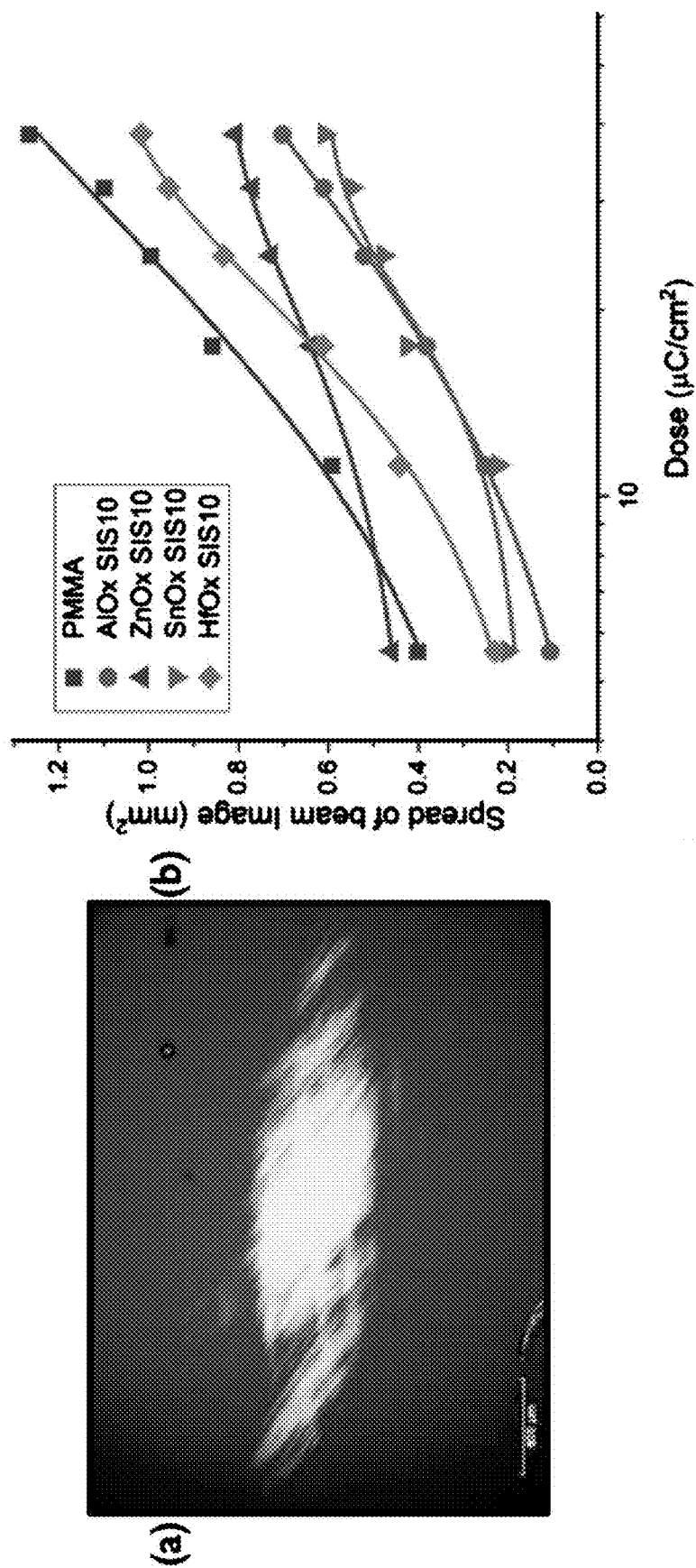
FIG. 6 depicts results from the EUV lithography experiments at NSLS-II (a) optical microscope image of the x-ray photoemission electron microscopy (XPEEM) beam onto PMMA after exposure to 24.5 mJ/cm² dose and development, and (b) analysis of the area spread of the beam on hybrid resists containing different metal oxides infiltrated into PMMA matrix.

Moreover, after fabricating nanoscale patterns with EBL, samples were also subjected to cryo-Si etching process. On account of improved etch resistance of the infiltrated hybrid resists, Si nanostructures with linewidth down to ~30 nm and high aspect ratio of ~17 were achieved. FIGS. 5 (c,d) depict the 500 nm linewidth structures etched down to ~700 nm with the starting resist thickness of ~60 nm while FIGS. 5 (e,f) portray highest resolution (~30 nm) structures we were able to etch with a depth of ~530 nm. These results demonstrate the etch selectivity of ~70 (for 4-cycle infiltrated resist) or ~310 (for 8-cycle infiltrated resist) compared to the PMMA or ZEP etch selectivity is marked 5 to 14-fold increment. This selectivity surpasses even the resist of choice for etch based processing such as ZEP and HSQ. Subsequent to the EBL study, the utility of these resist has also been investigated for EUV lithography using soft x-rays beamlines (XPEEM) at the NSLS-II light source, the results of which can be seen in FIG. 6. The variation in the beam spread for different metal oxide infiltration into PMMA matrix shows that the properties of the resist can be effectively modified with the present method.

An EBL dose test was performed on AlO$_x$-PMMA hybrid resist with 0-cycle i.e. PMMA as spin-coated, 4-cycles, and 8-cycles of AlO$_x$ infiltration. See FIG. 3.

Evolution of resist characteristics of the hybrid nanocomposite resist with increasing number of infiltration cycles dose response curve, and resist etch rate for commonly used etch recipes were tested. See FIG. 4.

Scanning electron micrographs of as developed submicron features patterned into 4-cycle infiltrated hybrid resist using EBL. See FIG. 5.

SEM images of Si nanostructures etched (0° tilted view) using 4-cycle infiltrated resist and under cryo-Si recipe −100° C. were taken. See FIG. 5.

EUV lithography experiments were conducted at NSLS-II and optical microscope image of the XPEEM beam onto PMMA after exposure to 24.5 mJ/cm² dose and development were taken. See FIG. 6A. Analysis of the area spread of the beam on hybrid resists containing different metal oxides infiltrated into PMMA matrix were conducted. See FIG. 6B.

Example 2, Liquid Phase Infiltration Method of Metals into a Resist Material. Pt is Infiltrated into PVP A liquid phase polymer metal hybridization in which the photoresist thin films spun on suitable substrates is immersed into a metal salt solution. The reactive metal ion species diffuses into the polymer and react with functional groups present within the polymer. For instance, PVP, a pyridine ring containing polymer, when protonated may form pyridinium ion which complexes with metal ion species including but not limited to PtCl$_4^{2-}$, AuCl$_4^{2-}$. The process is schematically depicted in FIG. 7(a), while a cross section TEM image of Pt hybridized PVP is shown in FIG. 7(b). The amount of infiltration can be controlled via controlling the metal salt concentration, infiltration time and infiltration temperature. After infiltration, the polymer films may be rinsed in solvents suitable for removing the loosely bound salt that may be remaining on the surface of the films and can subsequently be used for lithography purposes.

For example, the PVP photoresist thin films spun on suitable substrates are immersed into a metal salt solution (~20 mM) at a suitable, predetermined temperature (22° C.) for a predetermined soak time (60 sec). The main experimental parameters that are used to control the quantity of infiltration into the polymer film include metal salt solution concentration (1 mM to 100 mM), infiltration temperature (20° C. to 80° C.), infiltration soak time (0-1000 sec). After infiltration, the polymer films are rinsed in suitable solvents to remove the loosely bound salt remaining on the surface of the films and can be subsequently used for lithography purpose. Further ellipsometry or electron microscopy techniques are utilized to estimate the quantity of infiltration into the polymer film.

Ex-situ ellipsometry measurements, for instance can give an estimate of the infiltration quantity by changing the infiltration temperature. Increase in film thickness (Δ) as a result of hybridization of PVP photoresist with Na$_2$PtCl$_4$ complex salt solution is recorded as a function of infiltration temperature and time (FIG. 3). These hybrid films can be further patterned with electron beam and photolithography.

PVP photoresists were subject to the liquid phase infiltration described herein at the following temperatures 22° C., 42° C., 62° C., and 82° C., and the change in thickness was measured. See FIG. 22.

Example 3, Characterization of Metal-Infiltrated Resist Material by Lithography and Etching Lithograph-based patterning may contribute to achieving higher computing performance among integrated circuits by increasing the device areal density. However, there may be technological challenges, with cost-effective patterning at sub-30 nm dimensions being one. The patterning linewidth and throughput may depend on the resist materials. The semiconductor process may be dependent on CARs to obtain certain nanopatterns. However, when working with smaller nodes, these types of carbon-based resist materials may show poor etch resistance and therefore may be sufficiently allow for etching-based pattern transfer of high-aspect-ratio structures onto the substrate.

Study parameters of a EUV resist, viz.: Sensitivity (S), contrast (γ), resolution (R) and line-edge roughness (LER), in order to establish the performance of inorganic infiltrated photoresists for EUV patterning. Spin-coated thin films of polymeric resist on Si substrates are infiltrated with different concentrations of inorganic species. The higher atomic absorption of suitable inorganic additive atoms for EUV radiation is expected to improve the sensitivity of the original resist and, thus, increase the throughput of lithographic patterning step. The decrease in the required photon dose for patterning is also expected to decrease the photon shot noise and blurring effects of photoelectrons, leading to improved resolution and LER characteristics of the generated nano-patterns.

The resolution of an optical lithography system may depend on the wavelength used for patterning. Accordingly, industrial lithography instruments may exploit visible g line (436 nm), UV i-line (365 nm), deep UV 248 nm and 193 nm to achieve a desired pattern linewidth. For sub-10 nm nodes and beyond, EUV with 13.5 nm wavelength may be implemented for high volume manufacturing. Use of such a short wavelength for lithography may decrease the number of patterning steps in the fabrication process flow and the layout complexity by replacing multi-patterning steps with single-step EUV patterning.

The resists for EUV lithography may have requirements such as high optical absorption, high etch resistance, high sensitivity and resolution as well as low line edge roughness (LER). At sub-20 nm patterning dimensions, resists in the existing schemes may exhibit low sensitivity as well as high LER, effectively putting constraints on an attainable pattern resolution, while their poor etch resistance may be less than adequate for transferring high aspect ratio structures in the substrate. In order to overcome these challenges, metal-containing organic-inorganic hybrid resists are of interest.

Resist sensitivity and contrast extraction are tested using exposure dose tests by varying the exposure time at constant exposure intensity followed by the development of the resist. The thickness of the remaining resist in these regions are measured with stylus profilometer or AFM measurement and plotted against the exposure energy to estimate sensitivity and contrast of each resist composition. The sensitivity of pure organic matrixes under EUV exposures is expected to 10-25 mJ/cm$^2$.

Resist resolution and LER characterization is tested. For these tests, nanoscale patterns are exposed on the resist-coated sample Alternatively, interference lithography (IL) technique is implemented using either of the endstations. After development of the resist patterns, SEM is used to determine the resolution and LER of the developed patterns. Exposed patterns are subjected to reactive ion etching to demonstrate high-aspect ratio patterning capability.

Example 4, Electron Beam Lithography

Electron Beam Lithography:
E-beam exposure on the prepared samples was carried out using JEOL JBX-6300FS e-beam lithography system (100 kV). For the exposure matrix patterning typically 500 pA current was used to expose 5 μm square area with electron dose ranging from 50 μC/cm2 to 7000 μC/cm2 using a shot spacing of 8 nm. For exposing sub-micro sale features consisting of lines and elbow patterns 1 nA beam current and 4 nm shot spacing was used (exposure dose range differed for various formulations). After the exposure, samples were developed in methyl iso-butyl ketone (MIBK) solution in isopropyl alcohol (IPA) in the ratio of MIBK:IPA 1:3 for 45 sec followed by 15 sec rinse in IPA.

Example 5, Plasma Dry Etching

All ICP-RIE processing was conducted in Oxford Plasmalab 100. The plasma processing conditions are outlined as followed:

TABLE 1

| Process | Temperature | Pressure (mTorr) | RF Power (W) | ICP Power (W) | Gas flow rate |
|---|---|---|---|---|---|
| O$_2$ Etch | 20° C. | 30 | 200 | 0 | O$_2$ 50 sccm |
| SiO$_2$ Etch | 25° C. | 15 | 40 | 700 | O$_2$ 1.5 sccm CHF$_3$ 50 sccm |
| Cryo Si Etch (etch rate) | −100° C. | 15 | 15 | 800 | O$_2$ 12 sccm SF6 40 sccm |
| Cryo Si Etch (nanopatterning) | −100° C. | 15 | 15 | 800 | O$_2$ 16 sccm SF$_6$ 40 sccm |

For the etch rate measurements, the resist film thickness was measured after different etch times with the use of Woollam Spectroscopic Ellipsometer and Cauchy model fitting. Whereas, prior to plasma etching of nanopatterned structure a descum step consisting of 5 sec dip in commercially available ma-D 525 (micro resist technology GmbH) for 5 sec to remove inorganic residue followed by 10 sec 02 plasma ashing (20 W, 100 mTorr) under March Plasma.

Example 6, Comparative Benchmark Performance of Resists

The performance of several various e-beam lithography resist processes of the prior art, as compared to an exemplary e-beam lithography process of the present invention.

TABLE 2

Comparison of various e-beam lithography resist processes and their properties.

| Resist | Litho | Post Litho Treatment | LW (nm) | Etched Depth (nm) | Aspect Ratio | Dose (μC/cm$^2$) [*J/cm$^2$] | Etch Recipe | Resist Etch Rate (nm/min) | Si Etch Rate (nm/min) | Selectivity with Si |
|---|---|---|---|---|---|---|---|---|---|---|
| PMMA [1,2] | EBL | | 20 | 10 | 0.5 | ~500 | HBr | 300 | 100 | 3 |
| PMMA [1] | EBL | SIS | 18 | 130 | 7.22 | | HBr | <4 | 100 | >25 |
| PMMA [2] | EBL | SIS | ~150 | 1500 | ~10 | | HBr | ~8 | 100 | ~12.5 |
| ZEP520A [2] | EBL | | | | | | HBr | 100 | 100 | 1 |
| ZEP520A [2] | EBL | SIS | | | | | HBr | 20 | 100 | 5 |
| Al-Si complex [3] | Soft Xray (Neg) | 100° C. for 60 s | 400 | 3300 | 8.5-17.5 | 20* | SF$_6$-C$_4$F$_8$-Ar | 2.67 | 170 | >60 |

TABLE 2-continued

Comparison of various e-beam lithography resist processes and their properties.

| Resist | Litho | Post Litho Treatment | LW (nm) | Etched Depth (nm) | Aspect Ratio | Dose (μC/cm$^2$) [*J/cm$^2$] | Etch Recipe | Resist Etch Rate (nm/min) | Si Etch Rate (nm/min) | Selectivity with Si |
|---|---|---|---|---|---|---|---|---|---|---|
| Al-Si complex [4] | EBL 3 kV (Neg) |  | 20 | 400 | 20 | 200-250 | SF$_6$-C$_4$F$_8$-Ar | 2.67 | 170 | >100 |
| Al-Si complex [5] | EBL (Dual) 30 kV |  | <100, min 20 | 3000 | >30 | 800 | SF$_6$-C$_4$F$_8$-Ar | ~1.7 | 170 | 100 |
| HSQ [5] | EBL neg |  | 10 |  |  | 5000 | SF$_6$-C$_4$F$_8$-Ar |  | 170 | 6 |
| Exemplary example of the present invention 4-cycle hybrid | EBL 100 kV |  | 31.6 | 533 | 16.87 | ~2000 | SF$_6$-O$_2$-Cryo | 40.67 | ~2895 | ~71.2 |

Table 2 References:
[1] Y. C. Tseng, A. U. Mane, J. W. Elam, S. B. Darling, *Adv. Mater.* 2012, 24, 2608.
[2] Y.-C. Tseng, Q. Peng, L. E. Ocola, D. A. Czaplewski, J. W. Elam, S. B. Darling, *J. Mater. Chem.* 2011, 21, 11722.
[3] G. Grenci, G. Della Giustina, A. Pozzato, E. Zanchetta, M. Tormen, G. Brusatin, *Microelectron. Eng.* 2012, 98, 134.
[4] G. Grenci, E. Zanchetta, A. Pozzato, G. Della Giustina, G. Brusatin, M. Tormen, *Appl. Mater. Today* 2015, 1, 13.
[5] E. Zanchetta, G. Della Giustina, G. Grenci, A. Pozzato, M. Tormen, G. Brusatin, *Adv. Mater.* 2013, 25, 6261.

We claim:

1. A method of preparing metal-infiltrated resist material or metal oxide-infiltrated resist material for optical lithographic patterning, said method consisting essentially of:

Forming an organic thin film layer consisting of polymer as resist material for optical lithography on a substrate material, having a top surface opposite the substrate material;

infiltering a metal or a metal oxide into the organic thin film layer consisting of polymer to provide a metal-infiltrated resist material layer or a metal oxide-infiltrated resist material layer, wherein the metal-infiltrated resist material layer or the metal oxide-infiltrated resist material layer extends from the top surface towards the substrate material; and patterning the metal-infiltrated resist material layer or the metal oxide-infiltrated resist material layer by exposure to radiation during optical lithography selected from the group consisting of electron beam lithography (EBL), ultraviolet (UV) lithography, deep ultraviolet (DUV) lithography and extreme ultraviolet (EUV) lithography followed by development to provide an optical lithographically patterned metal-infiltrated resist material layer or metal oxide-infiltrated resist material layer, wherein infiltrating comprises vapor-phase infiltration by using atomic layer deposition tools, and wherein a maximum thickness of the metal-infiltrated resist material layer or the metal oxide-infiltrated resist material layer is 50 nm and the metal-infiltrated resist material layer or the metal oxide-infiltrated resist material layer has a thickness greater than about 1 nm.

2. The method according to claim 1, wherein said metal comprises: Al, Zn, Sn, Ti, Zr, Hf, In, Sb, Co, Ni, Pd, W, Pt, Au, Cu, Ga, Zn, Cr, Fe, or Cs.

3. The method according to claim 1, wherein said metal oxide is selected from the group consisting of but not limited to AlO$_x$, ZnO$_x$, SnO$_x$, HfO$_x$, TiO$_x$, ZrO$_x$, Ga$_2$O$_x$, InO$_x$.

4. The method according to claim 1, wherein said metal oxide is selected from the group consisting of Al$_2$O$_3$, ZnO, SiO$_2$, SnO$_2$, Ga$_2$O$_3$, HfO$_2$, ZrO$_2$, Nb$_2$O$_5$, and TiO$_2$.

5. The method according to claim 1, wherein the resist material is selected from the group consisting of: poly (methyl methacrylate) (PMMA) and similar acrylate based resist derivatives, ZEP series, CSAR series, polystyrene derivatives, polyvinylpyridine (PVP), poly(2-vinylpyridine) and poly(4-vinyl pyridine) derivatives, poly(methyl glutarimide) (PMGI), phenol formaldehyde resin (DNQ/Novolac), polyhydroxystyrene-based polymers, polyacrylonitrile, and polyimides.

6. The method according to claim 1, wherein said vapor-phase infiltration uses 1-12 cycles, 1-8 cycles, 1-4 cycles, 4-8 cycles, or 2-6 cycles.

7. The method according to claim 6, wherein said vapor-phase infiltration comprises contacting the resist material with the metal, the metal oxide, or a metal-based precursor for a total of 30-800 seconds, 30-500 seconds, 40-100 seconds, or 40-80 seconds.

8. The method according to claim 7, wherein said metal is a metal-based precursor and is selected from the group consisting of trimethylaluminum (TMA), diethyl zinc (DEZ), titanium isopropoxide, trimethyl gallium, and Tetrakis(diethylamido)tin.

9. The method according to claim 1, wherein said vapor-phase infiltration comprises contacting the resist material with water vapor for a total of 40-100 seconds or 40-80 seconds.

10. The method according to claim 1, wherein said metal-infiltrated resist material has a thickness of greater than about 5 nm, greater than about 10 nm, greater than about 15 nm, greater than about 20 nm, greater than about 25 nm, greater than about 30 nm, or greater than about 35 nm.

11. The method according to claim 1, wherein said metal-infiltrated resist material has a thickness of between about 5 nm and 50 nm, 5 nm and 40 nm, 10 nm and 50 nm, 10 nm and 40 nm, 20 nm and 40 nm, 1 nm and 20 nm, 10 nm and 20 nm, or 1 nm and 10 nm.

12. The method according to claim 1, wherein said patterning comprises exposing the metal-infiltrated resist material to a radiation source that has a wavelength that is less than 500 nm, less than 400 nm, less than 300 nm, less than 200 nm, less than 100 nm, less than 50 nm, or less than 20 nm.

13. The method according to claim 1, wherein the patterned metal-infiltrated resist material is used as a mask in an etching step to pattern the substrate material, wherein the patterned substrate material comprises nanostructures.

14. The method according to claim 13, wherein the method provides an etch selectivity of greater than 10, 15, or 20.

15. The method according to claim 13, wherein the nanostructures comprise an aspect ratio, said aspect ratio is greater than about 5, greater than about 10, greater than about 15, or greater than about 20.

16. The method according to claim 13, wherein the nanostructures comprise an aspect ratio, said aspect ratio is between about 5 and 50, 10 and 50, 10 and 30, or 15 and 25.

17. The method according to claim 13, wherein the nanostructures comprise a linewidth, wherein said linewidth is less than about 100 nm, less than about 50 nm, less than about 40 nm, less than about 35 nm, less than about 25 nm, less than 10 about nm, or less than about 5 nm.

18. The method according to claim 13, wherein the nanostructures comprise a linewidth, wherein said linewidth is between about 5 nm and 50 nm, 10 nm and 50 nm, or between 15 and 25 nm.

19. The method according to claim 1, further comprising: cryo-Si etching the patterned metal-infiltrated resist material to provide Si nanostructures having a linewidth of about 30 nm or less and an aspect ratio of 10-30.

20. The method according to claim 1, wherein the infiltrated metal oxide is a doped metal oxide.

21. The method according to claim 1 further comprising: infiltrating a combination of at least two metals, a combination of at least two metal oxides, or a combination of at least two doped metal oxides into the resist material to provide the metal-infiltrated resist material.

22. The method according to claim 1, wherein the EBL has an electron dose ranging from 50 $\mu C/cm^2$ to 7000 $\mu C/cm^2$, wherein the UV lithography has a wavelength of 365 nm, wherein the DUV lithography has a wavelength range of from 248 nm to 193 nm, and wherein the EUV lithography has a wavelength of 13.5 nm.

* * * * *